United States Patent
Nakayama et al.

[11] Patent Number: 6,058,486
[45] Date of Patent: *May 2, 2000

[54] TIMING GENERATOR FOR PLURAL REFERENCE CLOCK FREQUENCIES

[75] Inventors: Hiroyasu Nakayama, Kumagaya; Masayuki Itoh, Kazo, both of Japan

[73] Assignee: Advantest Corp., Tokyo, Japan

[ * ] Notice: This patent is subject to a terminal disclaimer.

[21] Appl. No.: 09/121,976

[22] Filed: Jul. 24, 1998

Related U.S. Application Data

[63] Continuation-in-part of application No. 08/620,102, Mar. 21, 1996, Pat. No. 5,903,745.

[30] Foreign Application Priority Data

Sep. 22, 1994 [JP] Japan .................................. 6-254354

[51] Int. Cl.[7] ...................................................... G06F 1/04
[52] U.S. Cl. ........................................... 713/500; 395/502
[58] Field of Search ..................................... 713/500, 502; 714/25, 724, 733, 734; 395/500.05, 500.07

[56] References Cited

U.S. PATENT DOCUMENTS

| | | | |
|---|---|---|---|
| 3,810,121 | 5/1974 | Chang et al. ........................... | 709/400 |
| 4,191,998 | 3/1980 | Carmody ................................. | 713/500 |
| 4,775,954 | 10/1988 | Fujieda et al. .......................... | 713/502 |
| 5,359,727 | 10/1994 | Kurita et al. ............................ | 713/400 |
| 5,430,737 | 7/1995 | Yamashita et al. ..................... | 714/736 |
| 5,442,642 | 8/1995 | Ingalls et al. ........................... | 714/733 |
| 5,553,276 | 9/1996 | Dean ....................................... | 713/500 |
| 5,590,137 | 12/1996 | Yamashita ............................... | 714/744 |

*Primary Examiner*—Thomas M. Heckler
*Attorney, Agent, or Firm*—Muramatsu & Associates

[57] ABSTRACT

A timing generator generates the same timing signals even when the frequency of a reference clock is changed. The timing generator includes a data memory for storing the timing data formed of quotient data and fractional data, a counter for counting the number of reference clock pulses and producing a delay time expressed by the quotient data, an accumulator for accumulating the fractional data and generating a carry signal when the accumulated value exceeds the reference clock period where the carry signal is provided to a cycle delay circuit for delaying an output of the counter by one cycle, a number converter for converting the timing data based on a ratio of first and second reference clocks, and a complementary number for compensating a time difference between the first and second reference clock periods.

9 Claims, 22 Drawing Sheets

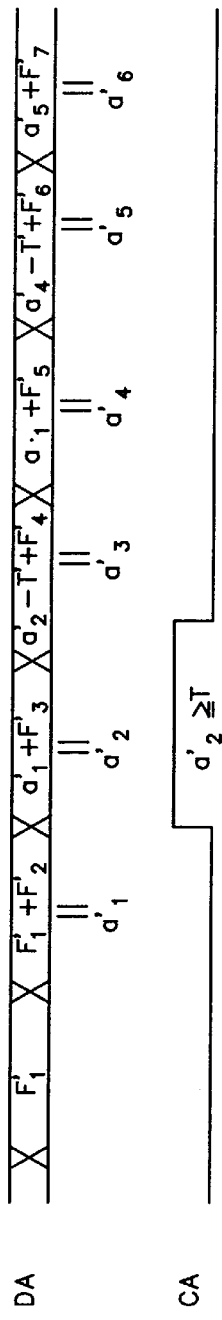
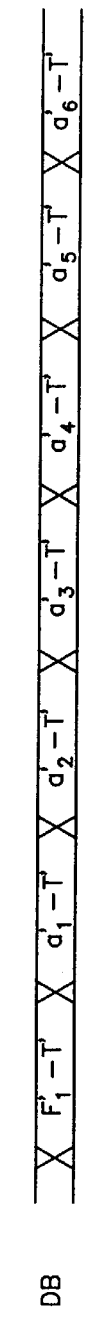
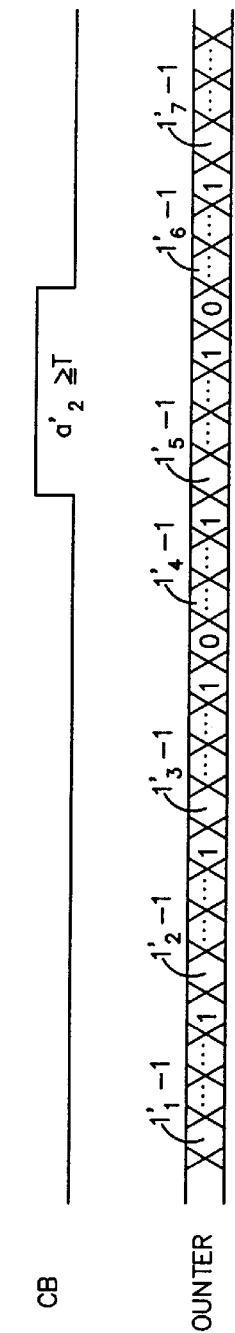
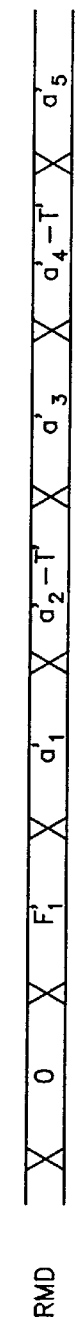
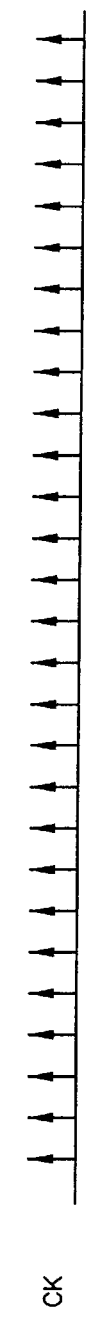

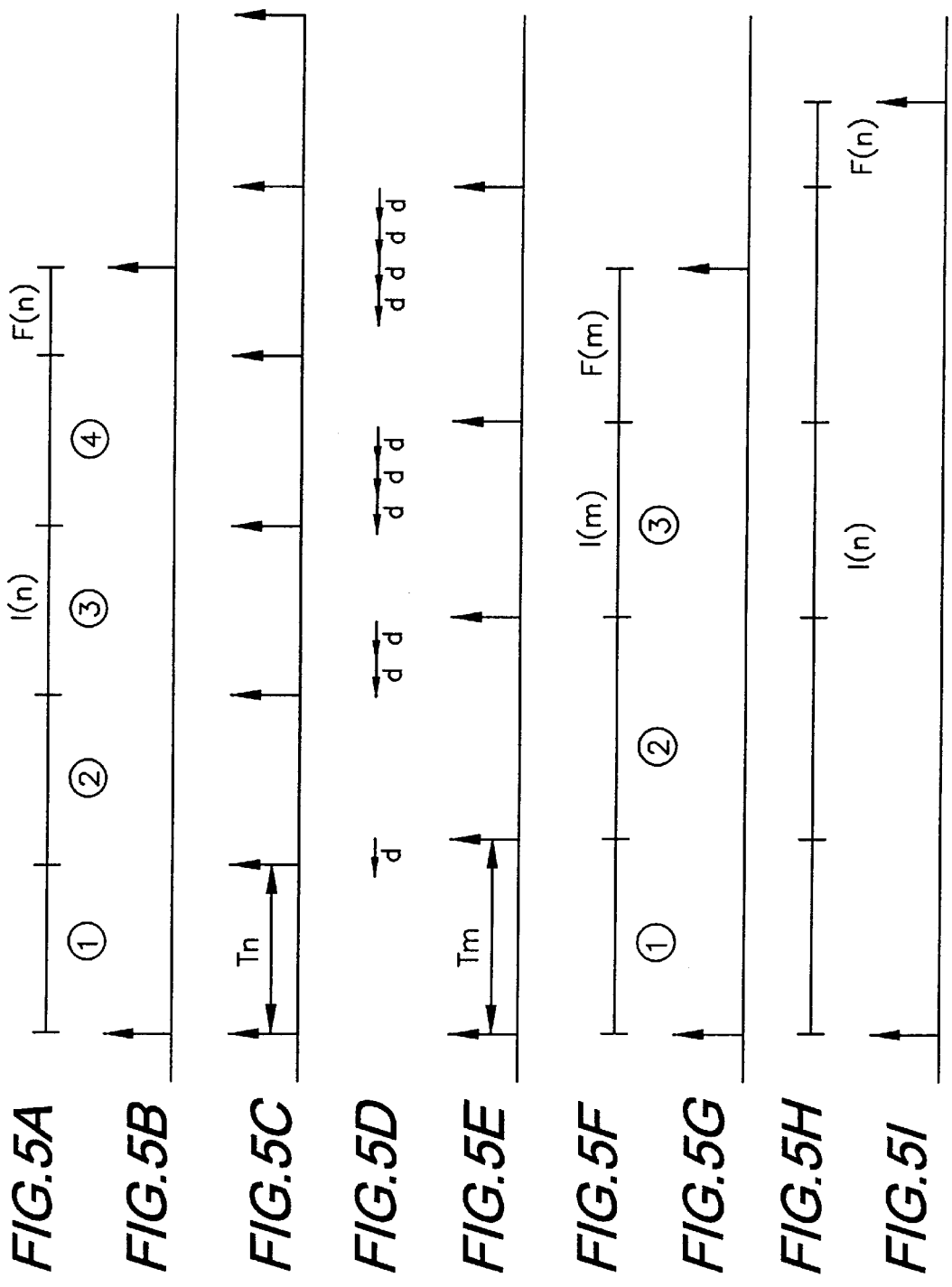

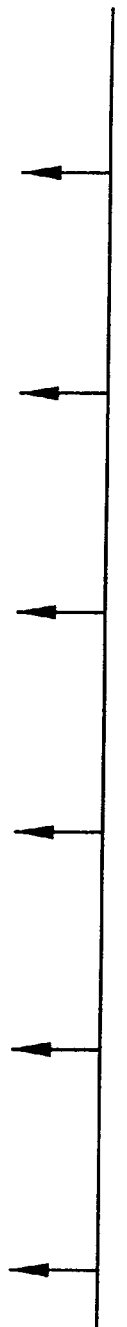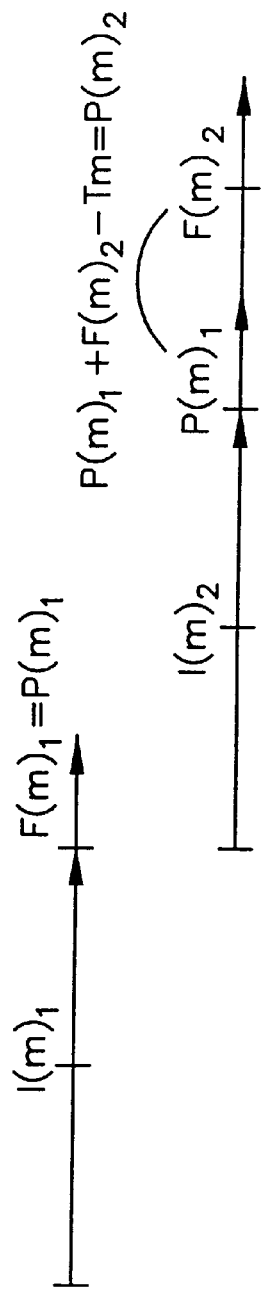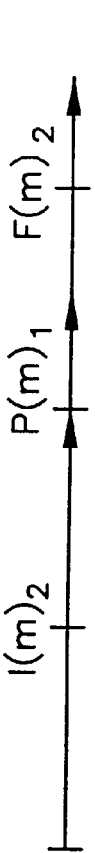
FIG. 6A MCLK
FIG. 6B
FIG. 6C
FIG. 6D

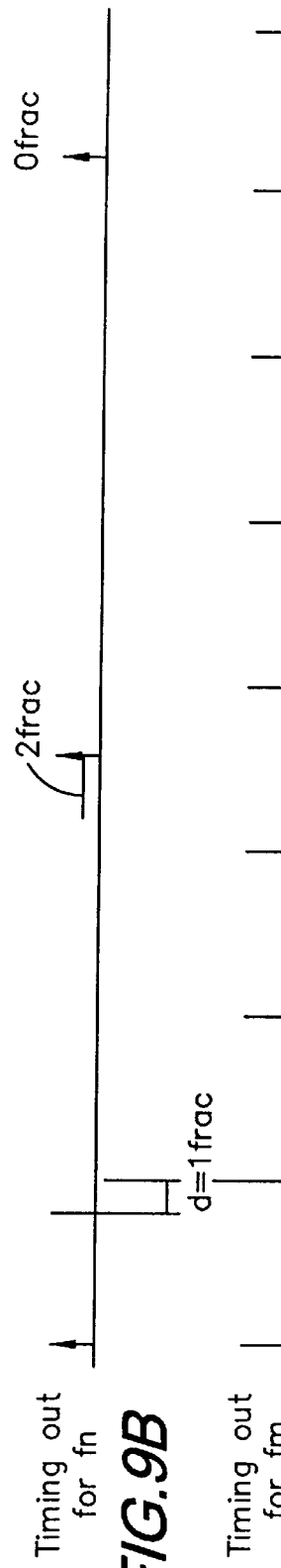
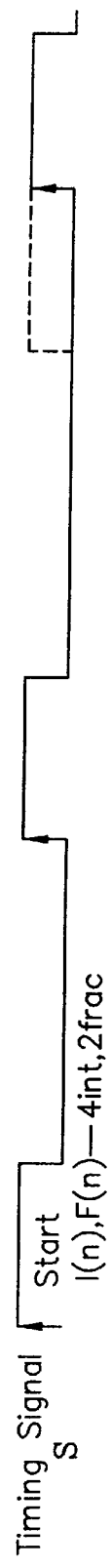
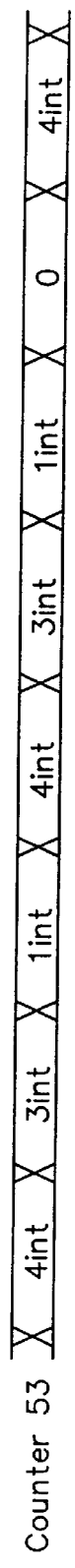
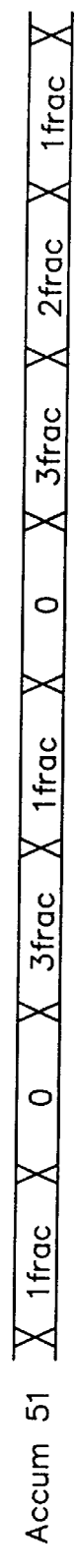

Carry A $$\begin{array}{r} 2frac+3frac \ 1frac+3frac \ 0+3frac \\ =1frac \quad\quad =4frac \quad =3frac \\ \underline{\quad\quad\quad d \quad =5frac} \end{array}$$

FIG.9G $$\begin{array}{llll} (0+1frac)+3frac & (0+3frac)+3frac & (3frac+0)+3frac & (1frac+2frac)+3frac \\ =4frac & =6frac & =6frac & =6frac \\ (0+0)+3frac & (3frac+1frac)+3frac & (3frac+3frac)+3frac & (1frac+1frac)+3frac \\ =3frac & =7frac & =9frac & =5frac \end{array}$$

Sum | 1frac X 0 X 3frac X 4frac X 3frac X 1frac X 3frac X 2frac

FIG.9H

Carry B

FIG.9I

RMD | 0 X 3frac X 1frac

FIG.9J

Timing out for fm |←— 3frac —→|←1frac→|

FIG.9K

| ADDRESS | #0 | #1 | #2 |
|---|---|---|---|
| RATE MEMORY | 35ns | 38ns | 30ns |
| Tmg MEMORY 1 (CLK1) | 0ns | 0ns | 0ns |
| Tmg MEMORY 2 (CLK2) | 7ns | 5ns | 8ns |
| Tmg MEMORY 3 (STRB) | 30ns | 15ns | 22ns |

FIG. 12 (Prior Art)

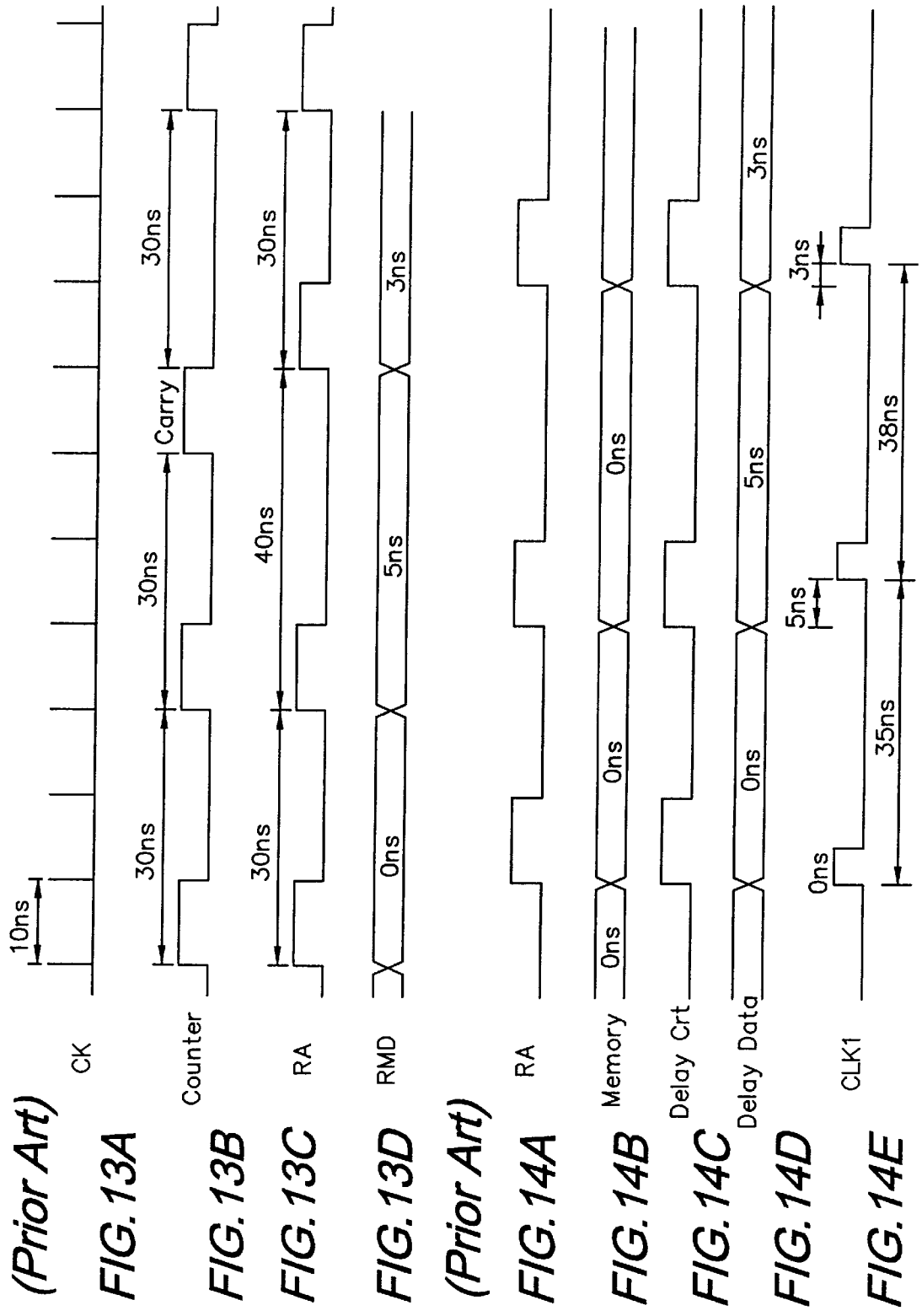

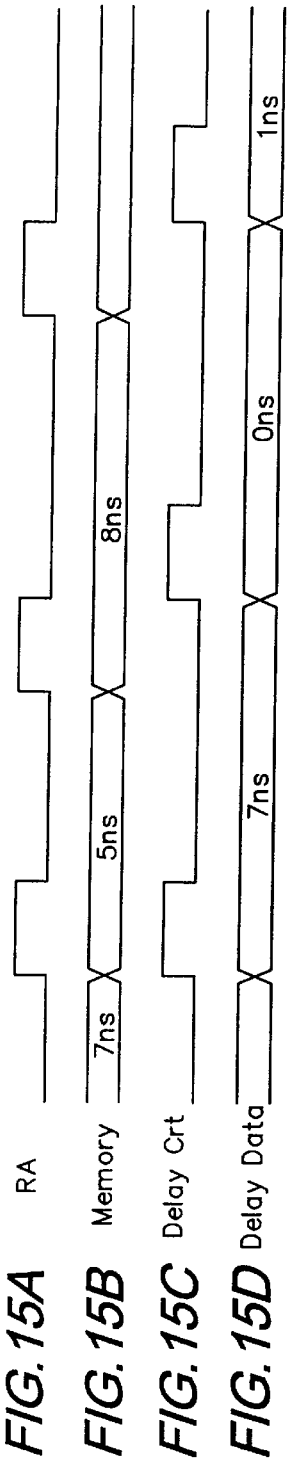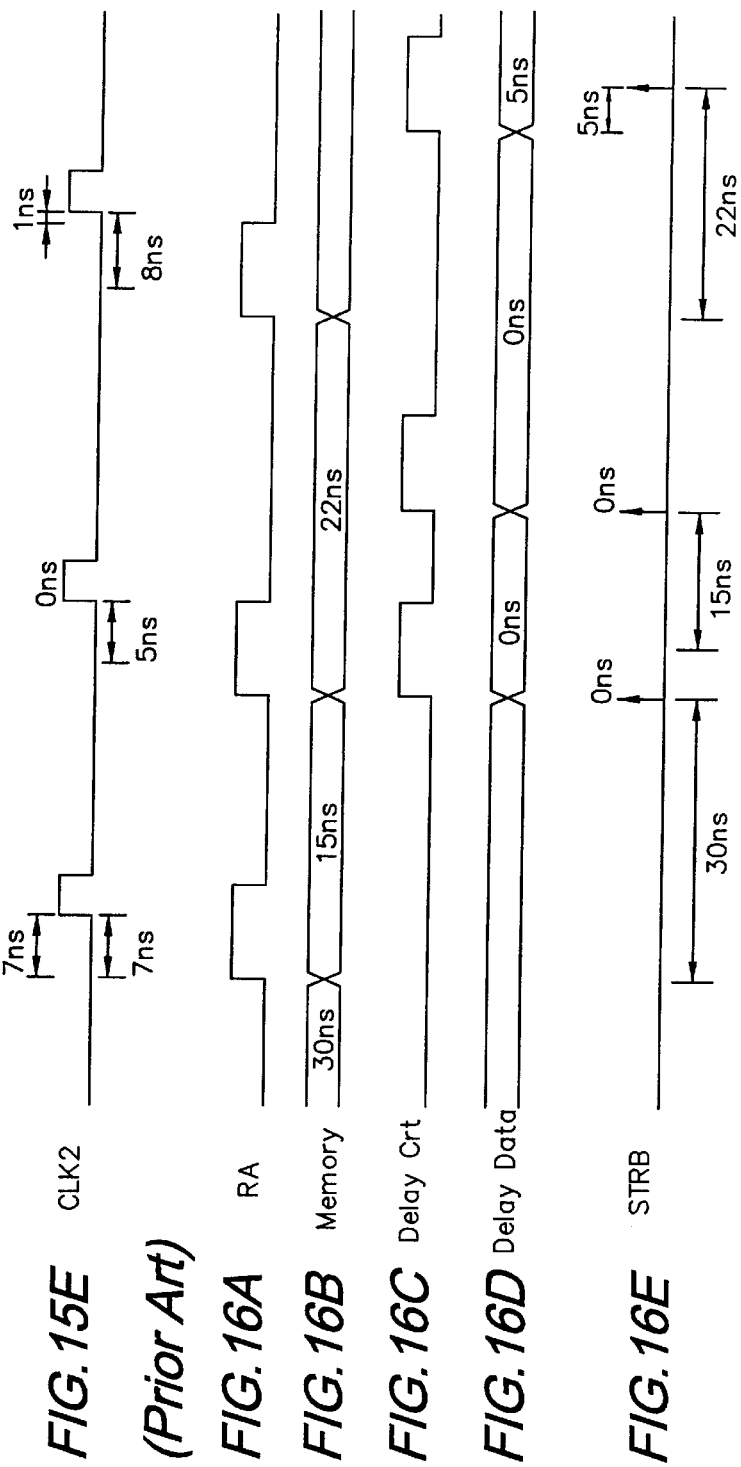

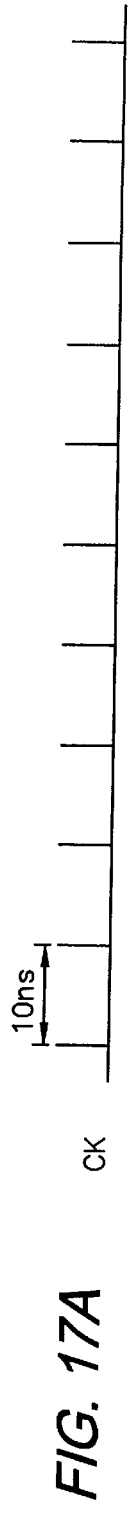
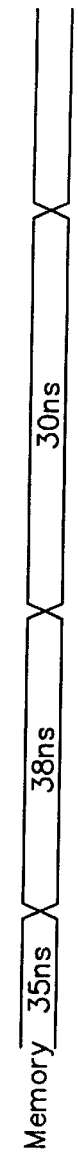
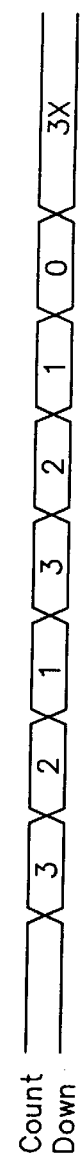
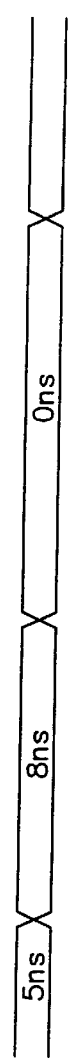
*(Prior Art)*
FIG. 17A
FIG. 17B
FIG. 17C
FIG. 17D
FIG. 17E
FIG. 17F

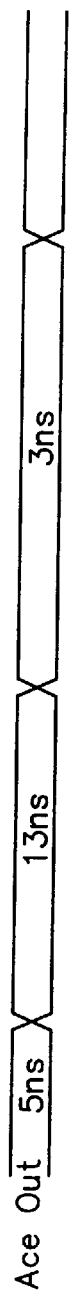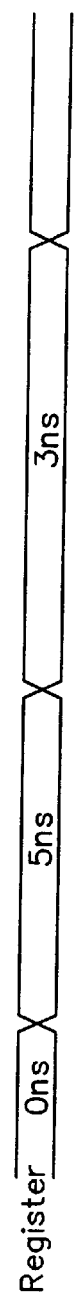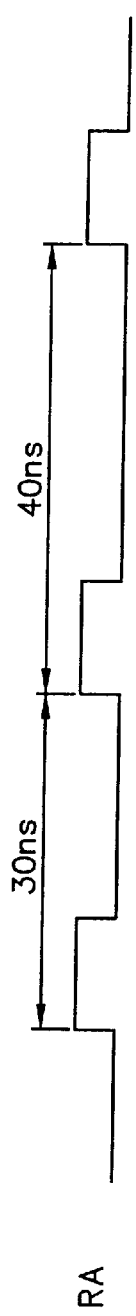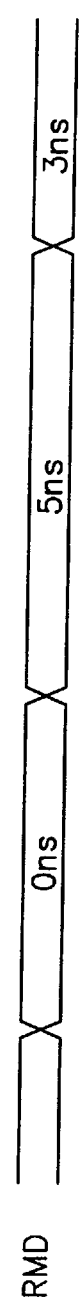
(Prior Art)
FIG. 17G
FIG. 17H
FIG. 17I
FIG. 17J
FIG. 17K

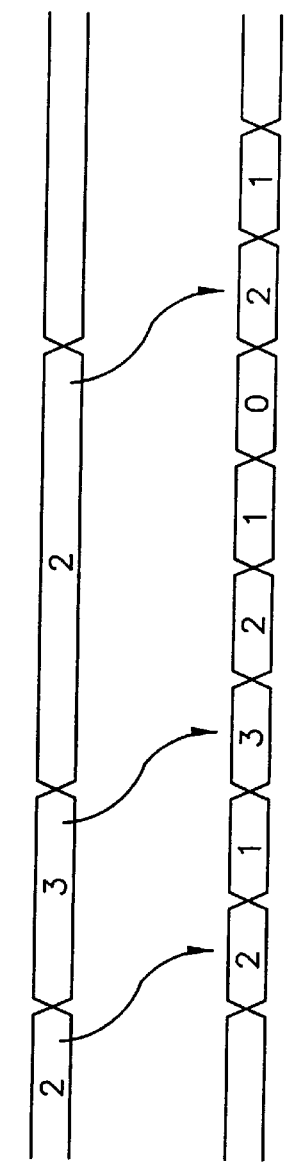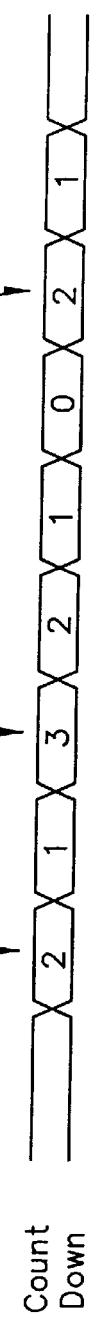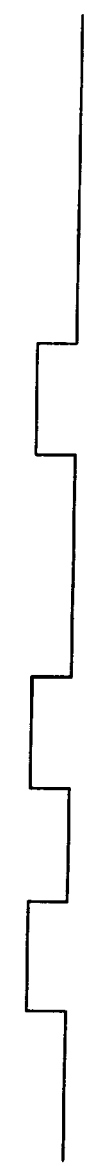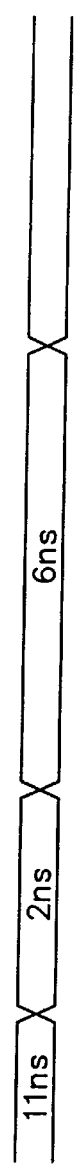
FIG. 19A CK
FIG. 19B Memory
FIG. 19C I
FIG. 19D Count Down
FIG. 19E Counter
FIG. 19F F

FIG. 19G  Acc Out
FIG. 19H  Register
FIG. 19I  Register
FIG. 19J  RA
FIG. 19K  RMD

TIMING GENERATOR FOR PLURAL REFERENCE CLOCK FREQUENCIES

This is a continuation-in-part of U.S. application Ser. No. 08/620,102 filed Mar. 21, 1996, now U.S. Pat. No. 5,903,745.

FIELD OF THE INVENTION

This invention relates to a timing generator for generating timing signals in a semiconductor test system, and more particularly, to a timing generator to generate signals of predetermined timings when a reference clock frequency has been changed without changing the timing data defined by the original reference clock frequency.

BACKGROUND OF THE INVENTION

In testing semiconductor IC devices by a semiconductor test system, such as an IC tester, a semiconductor IC device to be tested is provided with test signals at its appropriate pins at predetermined test timings defined relative to a tester rate or a previous timing signal. The IC tester receives output signals from the IC device under test generated in response to the test signals. The output signals are strobed, i.e., sampled, with a predetermined timing relationship or delay times with reference to the tester rate, and are compared with expected data to determine whether the IC device functions correctly.

Timing signals for producing various timings of the tester rate, test signals, and strobe signals are basically generated by a highly stabilized reference clock oscillator such as a crystal oscillator provided in the IC tester. When the required timing resolution in an IC tester is equal to or an integer multiple of the highest clock rate (shortest clock cycle) of a reference clock oscillator, timing signals can be generated by simply dividing the reference clock by a counter or a divider and synchronizing the divided output with the reference clock.

However, the modern IC testers are required to have timing resolution higher than the highest clock rate, i.e., the shortest time period, of a reference clock oscillator. For example, in the case where a clock rate of a reference clock oscillator available in the market is 10 ns (nanosecond), but an IC tester may need to have timing resolution of 0.1 ns such as a tester rate of 32.5 ns, a delay timing of 6.2 ns with reference to the start of the test rate, and the like. Furthermore, the modern IC testers dynamically change such timings in a cycle by cycle basis based on a test program.

To generate such timing signals with the timing resolution higher than the reference clock rate, it is known in the prior art that a combination of a counter and an accumulator can be used. In such an arrangement, high resolution timing signals which vary cycle by cycle can be generated based on the test program.

FIG. 10 is a block diagram showing an example of conventional semiconductor test system with an emphasis on a timing generator having such a combination of the counter and accumulator for generating the high resolution timing signals. The timing generator is generally formed of a rate generator 2 and a plurality of delay generators 3. A pattern generator 1 provides address data to write or read the timing data therein for generating timing signals. Although not shown, the pattern generator 1 also generates pattern data to determine a type of test signal and expected data to compare with resultant output signals from the device under test.

In the timing generator of FIG. 10, the rate generator 2 is to produce a rate signal (hereinafter "tester rate RA") which define a time length of each test cycle. The rate generator 2 is also to produce interpolation data RMD indicating a time length smaller than one reference clock period. Based on the tester rate RA and the interpolation data RMD, the delay generators 3 generate timing signals which define various timings within each tester rate RA such as timings of test signals (clocks) and strobe signals. Typically, such timing signals are defined by delay times relative to the start timing of the tester rate RA.

The rate generator 2 provides a tester rate RA and interpolation data RMD to the delay generator 3. The delay generator 3 combines delay times defined by the interpolation data RMD with the tester rate RA. The delay generator 3 further combines delay times defined by timing data stored in a timing memory therein. The test signals whose timings are thus determined by the delay generator 3 is wave-shaped by a wave formatter 38 and is applied to an IC device 4 to be tested. A pin electronics 39 interfaces the test signals through the wave formatter 38 with each pin of the IC device 4 to be tested. In an actual IC tester, a large number of delay generators 3 are prepared corresponding to the number of input/output pins of the IC device 4 to be tested.

The more detailed explanation of the conventional timing generator will be made with reference to FIGS. 10–12. The rate generator 2 includes a rate memory 21, an accumulator 22, registers 23 and 24, a counter 25, and a delay circuit 26. A reference oscillator 20 is also shown in the rate generator although it can be arranged in anywhere in the IC tester. The reference oscillator 20 oscillates at a frequency $f_{HZ}$, for example 100 $M_{HZ}$, which is a reference clock Ck and is used throughout the timing generator and other blocks of the IC tester. The rate memory 21 stores timing data which defines timings of a tester rate RA and interpolation data RMD for each test cycle. The timing data is formed through a software process based on types of test and IC devices to be tested as well as other factors.

The counter 25 receives data I in the timing data which is larger than and an integer multiple of the reference clock period T (=1/$f_{HZ}$) of the reference clock Ck. The accumulator 22 receives a part of the rate data (fractional data) F which shows a time length smaller than the reference clock period T. The accumulator 22 adds interpolation data RMD in the previous cycle of the reference clock Ck provided from the register 23 to the fractional data F from the rate memory 21. For example, in the case where the desired timing for this cycle is 32.5 ns (nanosecond) relative to the previous timing, and the reference clock period is 10 ns, the data 30 ns (or simply 3 which is an integer multiple of 10 ns) is provided to the counter 25 and the fractional data 2.5 ns is provided to the accumulator 22.

The counter 25 counts the number of pulses of the reference clock Ck. When the counted value coincides with the data from the rate memory, the counter 25 generates a coincidence signal. Thus, in the above example, when the data indicating 30 nanosecond is received by the counter 25, the counter 25 seeks the coincidence of the reference clock with the data from the memory 21 by counting the number of reference clock pulses. When counting three clock pulses, the counter 25 generates a coincidence signal which is provided to the delay circuit 26.

The accumulator 22 outputs a carry signal when the accumulated data exceeds the reference clock period T, which is 10 ns in the above example. The carry signal is provided to the delay circuit 26 through the register 24.

When the accumulated data does not exceed the reference clock period T, the resultant data is further added to the fractional data F from the rate memory 21 in the next cycle of the reference clock Ck. This process of accumulation is repeated throughout the generation of the timing signals in the IC tester.

When the carry signal is received from the accumulator 22 via the register 24, the delay circuit 26 produces a tester rate RA at the timing of the reference clock Ck coming immediately after the coincidence signal. Thus, every time the carry is generated by the accumulator, the delay circuit provides one cycle delay to the coincidence signal from the counter 25. The tester rate RA is supplied to the delay generator 3 to initiate the operation of the delay generator 3. The tester rate RA is also provided to the pattern generator 1 to access the next address of the rate memory 21. Further, in addition to the tester rate RA, the interpolation data RMD from the register 23 is received by the delay generator 3.

As noted above, a carry signal is not generated until the accumulated value in the accumulator 22 is reached the reference clock period T. Thus, so long as the carry signal is not received from the accumulator, the output of the counter 25 (coincidence signal) is transferred to the delay generator 3 as the tester rate RA. ***Thus, in this example, each period of the tester rates RA has a time length which is an integer multiple of the reference clock T.

As shown in FIG. 10, the delay generator 3 has a structure similar to the rate generator 2. The delay generator 3 includes a timing memory 31, an accumulator 32, registers 33 and 34, a counter 35, a delay circuit 36 and a variable delay circuit 37. The reference clock Ck is given to these circuit elements of the delay generator 3 to synchronize overall operations in the IC tester. The timing memory 31 stores timing data to determine the timings such as test signals and strobe signals with reference to the tester rate RA and the interpolation data RMD from the rate generator 2. The timing data for the timing memory 31 is formed through the software process similar to the rate memory 21 as noted above.

The counter 35 receives data I2 of the timing data from the timing memory 31 which is larger than and an integer multiple of the reference clock period T ($=1/f_{HZ}$) of the reference clock Ck in the manner same as the counter 25 in the rate generator 2. The accumulator 32 receives fractional data F2 in the timing data which is smaller than the reference clock period T. Similar to the rate generator 2, in the case where the desired timing of, for example a strobe signal or a test clock signal in a test cycle is 32.5 ns, and the reference clock period is 10 ns, the data 30 ns is provided to the counter 35 and the fractional data 2.5 ns is provided to the accumulator 32.

The counter 35 is, for example, counts the number of pulses of the reference clock Ck. When the counted value coincides with the data from the timing memory 31, the counter 35 generates a coincidence signal. Thus, when the data indicating 30 ns is received from the data memory 31, the counter 35 generates a coincidence signal when counting three pulses of the reference clock CK having 10 ns clock period. The coincidence signal is provided to the delay circuit 36. The accumulator 32 outputs a carry signal when the accumulated data exceeds the reference clock period T, 10 ns in this example. The carry signal is provided to the delay circuit 36 through the register 34.

When the carry signal is received, the delay circuit 36 provides a delay time which is equal to one cycle of the reference clock Ck to the coincidence signal. Thus, every time the carry signal is generated by the accumulator 32, the delay circuit 36 provides one clock cycle delay to the coincidence signal from the counter 35. The carry signal is not generated until the accumulated value in the accumulator 32 is reached the reference clock period T. Thus, when there is no carry signal, the output (coincidence signal) of the counter 35 is transferred from the delay circuit 36 to the variable delay circuit 37 without additional delay.

The output signal from the delay circuit 36 is provided with an additional delay time by the variable delay circuit 37. The delay time by the variable delay circuit 37 is determined by the variable delay data which is a sum of the fractional data from the timing memory 31 and the interpolation data RMD from the rate generator 2. The variable data is provided from the accumulator 32 and the register 33 to the variable delay circuit 37.

In the timing generator, a plurality of delay generators 3 are provided each of which is assigned to a test signal or strobe signal corresponding to a pin of the IC device under test. The test signal whose timing is thus determined by the delay generator 3 is wave shaped by the wave formatter 38 and is applied to the IC device 4 under test. The pin electronics 39 interfaces the test signal from the wave formatter 38 with the corresponding input/output pin of the IC device 4 under test.

Referring to FIGS. 11–13, the operation of the timing generator of FIG. 10 is explained for a case of generating a plurality of timing signals for IC testing. In this example, it is assumed that signals with timings shown in FIGS. 11A–11C are to be generated for testing an IC device. Test signals (or clock signals) CLK1 and CLK2 are to be supplied to the IC device under test while a strobe signal STRB is used for sampling the resultant output signal from the IC device under test. The timing relationship between the test signals CLK1, CLK2 and STRB are also illustrated in FIGS. 11A–11C, respectively. In this example, it is also assumed that the time period of the reference clock Ck is 10 nanosecond.

As noted above, a plurality of delay circuits 3 are used in the timing generator. To generate these timing signals of FIG. 11, with the use of the timing generator of FIG. 10, the test signal CLK1 is assigned to a delay generator $3_1$, and the test signal CLK2 is assigned to a delay generator $3_2$, and the strobe signal STRB is assigned to a delay generator $3_3$. In this setting, each memory in the timing generator stores the timing data as shown in FIG. 12. The rate memory 21 is a memory in the rate generator 2 and the timing memories $31_1$–$31_3$ are memories correspond provided in the timing generators $3_1$–$3_3$. The address data is provided to the rate memory 21 and to the timing memories $31_1$–$31_3$ in the order of #0, #1, #2 . . . as shown in FIG. 12.

Since the test signal CLK1 is a reference for the other timings in this example, the rate memory 21 is provided with the timing data of 35 ns, 38 ns and 30 ns for the addresses #0, #1 and #2, respectively. The timing memory $31_1$ for generating the test signal CLK1 stores the timing data of 0 ns, 0 ns and 0 ns, with respect to the addresses #0, #1, #2. The timing memory $31_2$ for generating the test signal CLK2 stores the timing data of 7 ns, 5 ns, and 8 ns for the respective addresses of #0, #1, and #2. The timing memory $31_3$ for generating the strobe signal STRB stores the timing data 30 ns, 15 ns and 22 ns, respectively. As noted above, the fractional data F for the accumulator 22 in the rate generator 2 is 5 ns, 8 ns and 0 ns, respectively, which are differences among the integer multiple of the reference clock period 10 ns and the timing data in the rate memory 21.

FIGS. 13–17 are timing charts showing operations in the rate generator 2 and delay generators $3_1$–$3_3$ for generating the test signals CLK1, CLK2 and strobe signal STRB with the timings of FIG. 11. FIGS. 13A–13D are timing charts of the rate generator 2, FIGS. 14A–14E, 15A–15E, 16A–16E are timing charts of the delay generators $3_1$–$3_3$, respectively. The rate memory 21 and the timing memories $31_1$–$31_3$ store the timing data as noted above through a software process.

As shown in FIG. 13A, the time period T of the reference clock Ck is 10 ns. The counter 25 in the rate generator 2 receives the data from the rate memory 21 and counts the reference clock Ck. The data in this case is 30 ns and thus, when counting three pulses, the counter 25 outputs a coincidence signal for every 30 ns as shown in FIG. 13B. Because the accumulator 22 generates a carry, when accumulating the fraction data 5 ns and 8 ns, the delay circuit 26 generates the tester rate RA which is one clock cycle delayed by the reference clock period T as shown in FIG. 13C. Thus, the tester rate RA in this example shows 30 ns for the test first cycle and 40 ns for the next test cycle.

The interpolation data RMD in the second cycle of FIG. 13D indicates 5 ns since the fractional data of 5 ns is provided through the accumulator 22 and the register 23 which is delayed by one cycle. In the second cycle, the next fraction data of 8 ns is accumulated by the previous RMD of 5 ns which is returned from the register 23. Thus, the accumulator 22 generates the carry indicating 10 ns as noted above, and the remainder data of 3 ns is provided as the interpolation data RMD at the output of the register 23. In this manner, the interpolation data RMD is dynamically changed in each clock cycle by the accumulator 22 based on the fractional data in the rate memory 21.

The tester rate RA is received by the delay generator $3_1$ through the counter 35 as shown in FIG. 14A. As noted above with reference to FIG. 12, the timing memory $31_1$ stores the timing data indicating 0 ns, 0 ns and 0 ns for the respective three cycles as shown in FIG. 14B. There is no carry signal is generated by the accumulator 32, because the accumulation of the timing data and the interpolation data RMD in this situation will not exceed the reference clock period 10 ns. Thus, the delay circuit 36 outputs a signal having the same timing relationship as the tester rate received by the counter 35 as shown in FIG. 14C.

The output of the delay circuit 36 is received by the variable delay circuit 37 which is controlled by delay data from the register 33. Since the timing data stored in the timing memory 31 is 0 ns for three test cycles as above, the output of the accumulator 32 is unchanged from the interpolation data RMD, which is transferred to the register 33 in the next clock cycle. Therefore, the delay data from the register 33 shown FIG. 14D is the same data as the interpolation data RMD of FIG. 13D.

The variable delay circuit 37 adds a high resolution delay time based on the delay data from the register 33 to the output of the delay circuit 36. For the first test cycle, the delay time 5 ns is added to the second pulse, and for the second test cycle, the delay time 3 ns is added to the third pulse. As a result, the test signal CLK1 as shown in FIG. 14E is generated by the delay generator $3_1$.

In the similar manner, the tester rate RA is received by the delay generator $3_2$ from the counter 25 of the rate generator 2 as shown in FIG. 15A. As noted with reference to FIG. 12, the timing memory $31_2$ stores the timing data indicating 7 ns, 5 ns and 8 ns for the respective three cycles as shown in FIG. 15B. A carry signal is not generated by the accumulator 32 for the first test cycle since accumulation of the interpolation data RMD is 0 ns, i.e., the sum of the data RMD and the timing data 7 ns will not exceed the reference clock period 10 ns. Thus, the accumulator 32 provides the delay data to the register 33 without change. The register 33 transfers the data indicating 7 ns to the variable delay circuit 37 in synchronism with the next reference clock Ck as shown in FIG. 15D.

In the second cycle, since the accumulation of the timing data 5 ns and the interpolation data RMD of 5 ns results in 10 ns, the accumulator 32 produces a carry signal which is supplied to the delay circuit 36 through the register 34. Thus, second pulse from the delay circuit 36 is delayed by one reference clock cycle, i.e., 10 ns, as shown in FIG. 15C. The delay data from the register 33 indicates 0 ns as shown in FIG. 15D, which is supplied to the variable delay circuit 37.

Similarly, in the next test cycle, the timing data of 8 ns and the RMD 3 ns are added which exceeds the reference clock period 10 ns. Thus, a carry signal is generated which again delays the third pulse from the delay circuit 36 by one clock cycle. The delay data from the register 33 indicates 1 ns which is a difference between 11 ns (8 ns plus 3 ns) and the reference clock period 10 ns, and is provided to the variable delay circuit 37 as shown in FIG. 15D.

The output of the delay circuit 36 is received by the variable delay circuit 37 which is controlled by the delay data from the register 33. Since the delay data from the register 33 is 7 ns in the first test cycle, the delay time 7 ns is added to the first pulse from the delay circuit 36 which results in the first pulse of the test signal CLK2 of FIG. 15E. For the next pulse, the delay time is 0 ns. For the third pulse, the delay time 1 ns is added by the variable delay circuit 37. Thus, the test signal CLK2 is generated as shown in FIG. 15E.

Regarding the strobe signal STRB, the tester rate RA is received by the delay generator $3_2$ from the counter 25 of the rate generator 2 as shown in FIG. 16A. As noted above with reference to FIG. 12, the timing memory $31_3$ stores the timing data indicating 30 ns, 15 ns and 22 ns for the respective three cycles as shown in FIG. 16B. Since the timing data of 30 ns is greater than the reference clock period 10 ns, the data 30 ns is given to the counter 35 which down counts the number of reference clock Ck.

Thus, the output of the counter 35 is delayed by 30 ns for the first pulse which is transferred at the output of the delay circuit 36 as shown in FIG. 16C. For the second pulse, the timing data of 10 ns is provided to the counter 35 while the fractional data of 5 ns is provided to the accumulator 22. Thus, the counter 35 generates its output signal which is delayed by 10 ns from the second pulse of tester rate RA. The fractional data 5 ns is accumulated with the RMD data 5 ns by the accumulator 32 which produces a carry signal. The carry signal from the register 34 further causes one cycle delay in the delay circuit 36, i.e., an overall delay of 20 ns from the second pulse of the tester rate RA as shown in FIG. 16C.

For the third pulse, the timing data 20 ns is provided to the counter 35 and the fraction data 2 ns is provided to the accumulator 22. Thus, the third pulse from the delay circuit 36 is delayed by 20 ns and the delay data which is the sum of the RMD data 3 ns and the fraction data 2 ns is produced at the output of the register 33 as shown in FIG. 16D. The strobe signal STRB is generated by combining the delay time from the register 33 with the output signal from the delay circuit 36 as shown in FIG. 16E.

FIGS. 17A–17K are timing charts showing the more details of the operation of the rate generator 2 many aspects of which are the same as that shown in the timing charts of FIGS. 13A–13D. The reference clock Ck in FIG. 17A has the time period of 10 ns. The rate memory 21 stores the rate data 35 ns, 38 ns and 30 ns for the first three test cycles as shown in FIG. 17B which is also listed in FIG. 12. The rate memory 21 stores the rate data 35 ns, 38 ns and 30 ns for the first three cycle in FIG. 17B and the counter 25 is provided with data indicating 30 ns or three counts for each test cycle as in FIG. 17C. Thus, the counter 25 down counts the reference clock Ck in FIG. 17D and generates the coincidence signal for every 30 ns as in FIG. 17E.

The fractional data F in this situation is 5 ns, 8 ns, and 0 ns as in FIG. 17F which is applied to the accumulator 22 from the rate memory 21. In the first test cycle, since the fractional data is less than the reference time period T (10 ns), the carry signal is not generated by the accumulator 22. Thus, the fractional data 5 ns at the output of the accumulator 22 as shown in FIG. 17G is provided at the output of the register 23 in the next clock cycle as in FIG. 17H.

In the second test cycle, the accumulator 22 receives the fractional data 8 ns which is added to the interpolation data 5 ns returned from the register 23. Thus, the accumulated result is 13 ns which exceeds the reference 10 ns period. The accumulator 22 generates a carry signal which is received by the delay circuit 26 through the register 24 in the next clock cycle as in FIG. 17I. Also in the next cycle, the remainder data indicating 3 ns is transferred from the accumulator 22 to the register 23 as in FIG. 17G.

The delay circuit 26 outputs the input signal from the counter 26 with the same timing as the tester rate RA in synchronism with the reference clock Ck. When receiving the carry signal from the register 24, the delay circuit 26 provides a 10 ns delay to the input (coincidence) signal so that the tester rate RA expanded by 10 ns for the corresponding test cycle.

Thus, as shown in FIG. 17J, in the first test cycle, the time interval of the tester rate RA is 30 ns while in the second test cycle, the time interval is 40 ns because of the carry from the accumulator 22. The interpolation data RMD is produced at the register 23 as shown in FIG. 17K. As in the example of FIGS. 13–16, the tester rate RA and the interpolation data RMD are supplied to the delay generators $3_1$–$3_3$ to form the required test signals and strobe signals.

FIG. 18 shows another example of circuit configuration for forming a timing generator of the kind of FIG. 10 based on the accumulator and the counter. The timing data greater than the reference clock period T is provided to a counter 125 while the fractional data smaller than the reference clock period T is provided to an accumulator 122. When the fractional data accumulated to the previous data returned from a register 123 is greater than the reference clock period T, for example 10 ns, the accumulator 122 provides a carry signal to the counter 125.

When receiving the carry signal, the counter 125 holds the operation for the corresponding reference cycle. The output of the counter 125 is received by a variable delay circuit 137 wherein a delay time defined by the delay data from the register 123 is added to the counter output provided through a coincidence detector 126. The output signal of the variable delay circuit 137 is used as a test signal or a strobe signal as described above.

In the conventional timing generators as described above, however, are not able to generate the same timing signals when the reference clock period is changed. When the reference clock is changed, the data stored in the rate memory or the timing memory has to be changed accordingly by modifying a test program. In other words, in the conventional timing generator, the software (test program) cannot be compatible when the frequency of the reference oscillator is changed. Such a need of the frequency change in the reference clock arises, for example, when two or more IC testers having different reference frequencies one another are to be used in a parallel fashion while using the same timing signals.

In the timing generators as shown in FIGS. 10 or 18, the weight of the data to be supplied to the counters and the accumulators varies with the change of the reference frequency. Thus, it is not possible to generate the same timing signals for the new reference frequency without changing the timing data to be stored in the rate memory or timing memories. Namely, if the reference frequency or period has been changed from Tn to Tm, the rate data and the timing data for the reference period Tm have to be changed from that of the reference period Tn for the ratio expressed by Tn/Tm. This means that the test program cannot be compatible in this situation, since the rate data and timing data are included in the existing test program.

SUMMARY OF THE INVENTION

It is an object of the present invention to provide a timing generator which is capable of generating the same timing signals even when the reference clock frequency is changed without changing the timing data to be stored in data memories of the timing generator.

It is another object of the present invention to provide a timing generator which is capable of generating the same timing signals when the reference clock frequency is changed without changing the program for forming the timing data to be stored in the data memories in the timing generator.

It is a further object of the present invention to provide a timing generator which is capable of producing data to compensate the changes derived from the variation of the reference clock frequencies without changing the test program.

It is a further object of the present invention to provide a timing generator which is capable of generating the same timing signals among a plurality of IC testers having different reference clock frequencies.

In one aspect of the present invention, the timing generator compensates the difference between the reference clock frequencies by converting the base number for generating the timing signals corresponding to the ratio of reference clock frequencies without changing the timing data provided by the software process.

The timing generator of the present invention includes: a data memory for storing the timing data which defines a time length of a timing signal wherein the timing data is formed of data which is a quotient of a division of the time length by a time period of a reference clock and fractional data which is a remainder of the division, a counter for counting the number of pulses of the reference clock and producing a delay time expressed by the quotient when the number of the pulses matches the quotient, an accumulator for accumulating the fractional data and data of the previous cycle and generating a carry signal when the accumulated value exceeds the time period of the reference clock wherein the carry signal is provided to a cycle delay circuit for delaying an output of said counter by one time period, a number converter which converts the timing data based on a ratio of a first reference clock period and a second reference clock period, and a means for providing a complementary number for the second reference clock period to the accumulator for compensating a time difference between the first and second reference clock periods.

In the second aspect of the present invention, the timing generator compensates the difference between the reference clock frequencies without converting the base number but using the same timing data defined under the previous reference clock frequency for generating timing signals under the new reference clock frequency.

In the second aspect of the present invention, the timing generator includes; a data memory for storing the timing data which defines a time length of a timing signal wherein the timing data is formed of data which is a quotient of a division of the time length by a time period of a reference clock and fractional data which is a remainder of the division, a counter for counting the number of pulses of the reference clock and producing a delay time expressed by the quotient when the number of the pulses matches the quotient, an accumulator for accumulating the fractional data and data of the previous cycle and generating a carry signal when the accumulated value exceeds the time period of the reference clock wherein the accumulator includes a difference accumulator which accumulates a time difference between a first reference clock and a second reference clock for each clock cycle of the second reference clock, and a phase accumulator which accumulates data generated by the difference accumulator. The counter additionally counts by one count when receiving a carry signal from the difference accumulator and suspends a counting operation by one clock cycle when receiving a carry signal from said phase accumulator.

In a modified version of the second aspect of the present invention, the phase accumulator generates the carry signal which is provided to a cycle delay circuit for delaying an output of the counter by one cycle of the reference clock, and the counter additionally down counts by one when receiving a carry signal from the difference accumulator.

According to the generator of the present invention, the same timing signals can be generated even when the reference clock frequency is changed, without changing the timing data defined based on the previous reference clock frequency. The timing data is described in the software such as a test program to be stored in the data memories of the timing generator. Accordingly, the timing generator of the present invention can generate the same timing signals when the reference clock frequency is changed without changing the test program, resulting in high efficiency in IC device testing.

BRIEF DESCRIPTION OF THE DRAWINGS

FIGS. 3A–3I are timing charts showing an operation of the timing generator of the present invention when the reference clock frequency is changed from f to f'.

FIGS. 5A–5I are timing charts showing an operation of the difference accumulator 51 which is used in the embodiment of FIGS. 4A and 4B.

FIGS. 6A–6I are timing charts showing an operation of the phase accumulator 52 which is used in the embodiment of FIGS. 4A and 4B.

FIGS. 9A–9K are timing charts showing an operation of the timing generator in accordance with the second embodiment of the present invention.

FIG. 12 is a diagram showing the data to be stored in the rate memories and timing memories in the timing generator of FIG. 10.

FIGS. 13A–13D are timing charts showing an operation of the rate generator in the timing generator of FIG. 10 for generating the timing signals of FIG. 11.

FIGS. 14A–14D are timing charts showing an operation of the first delay generator in the timing generator of FIG. 10 for generating the test signal CLK1 of FIG. 11.

FIGS. 15A–15E are timing charts showing an operation of the second delay generator in the timing generator of FIG. 10 for generating the test signal CLK2 of FIG. 11.

FIGS. 16A–16E are timing charts showing an operation of the third delay generator in the timing generator of FIG. 10 for generating the strobe signal STRB of FIG. 11.

FIGS. 17A–17K are timing charts showing a more detailed operation of the rate generator in the timing generator of FIG. 10 for generating the timing signals of FIG. 11.

FIGS. 19A–19K are timing charts showing the effects of the present invention for generating the timing signals of FIG. 11A when the reference clock frequency is changed from fn to fm without changing the data in the software.

DETAILED DESCRIPTION OF THE PREFERRED EMBODIMENT

Figure 1:
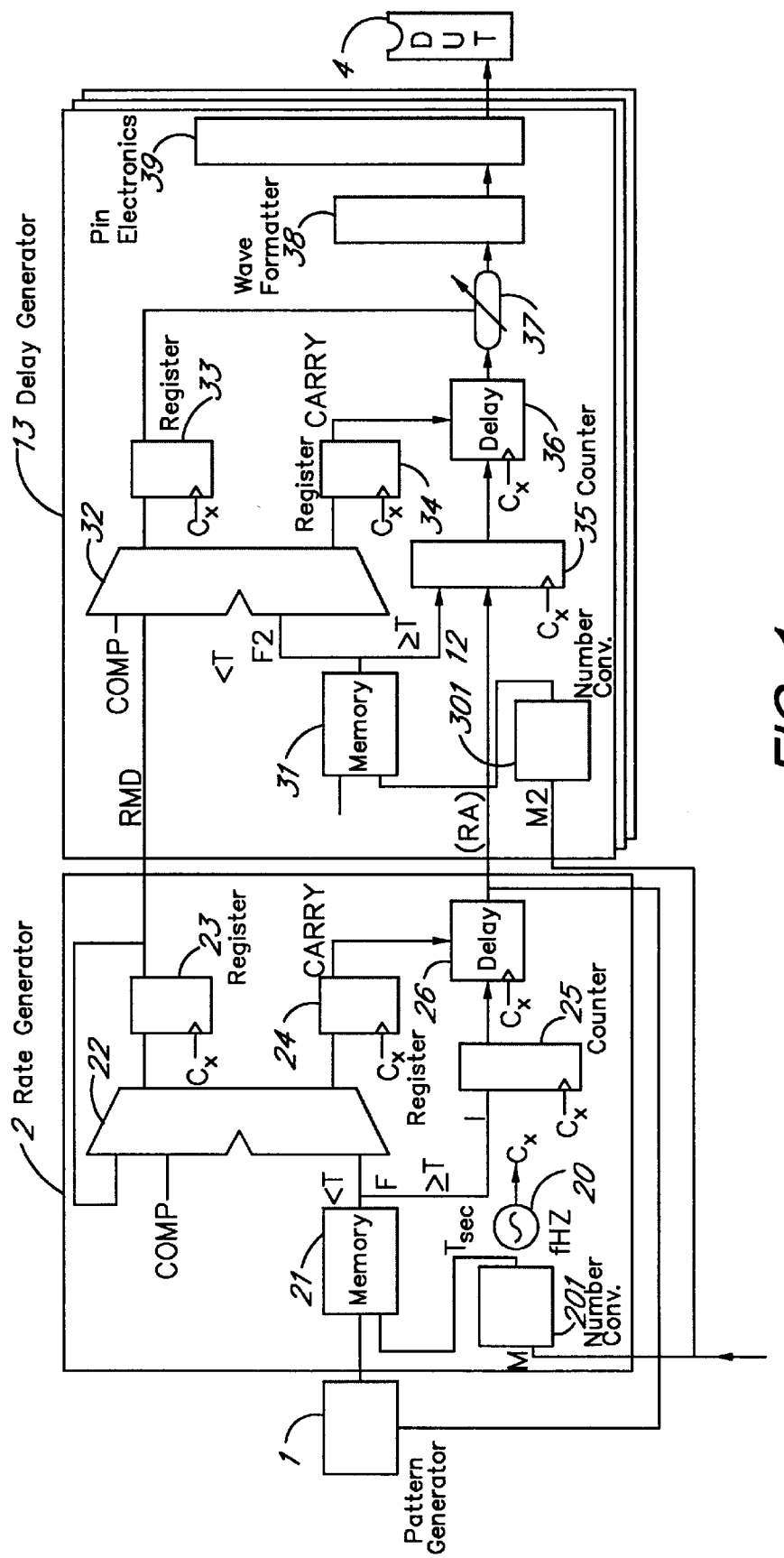
FIG. 1 is a block diagram showing the first embodiment of a timing generator for plural reference clock frequencies in accordance with the present invention.

FIG. 1 is a block diagram showing a first embodiment of the present invention which is a timing generator for accommodating plural reference clock frequencies without changing the timing data. In FIG. 1, the timing generator is generally formed of a rate generator 12 and a plurality of delay generators 13. A pattern generator 1 provides address data to the rate generator 12 to specify timing data for each test pattern cycle. Although not shown, the pattern generator 1 also generates pattern data to specify a type of test signals to be applied to the device under test and a type of expected data to compare with resultant output signals from the device under test.

The rate generator 12 provides a tester rate RA and interpolation data RMD to the delay generators 13. Each of the delay generators 13 adds a delay time defined by the interpolation data RMD to the tester rate RA from the rate generator 12. The test signal whose timing is thus determined by the delay generator 13 is wave-shaped by a wave formatter 38 and is applied to a semiconductor device under test 4 through a pin electronics 39 which interfaces the IC tester with each pin of the device under test 4. In an actual IC tester, a large number of delay generators 13 are prepared corresponding to the number of input pins of a semiconductor device to be tested.

Figure 10:
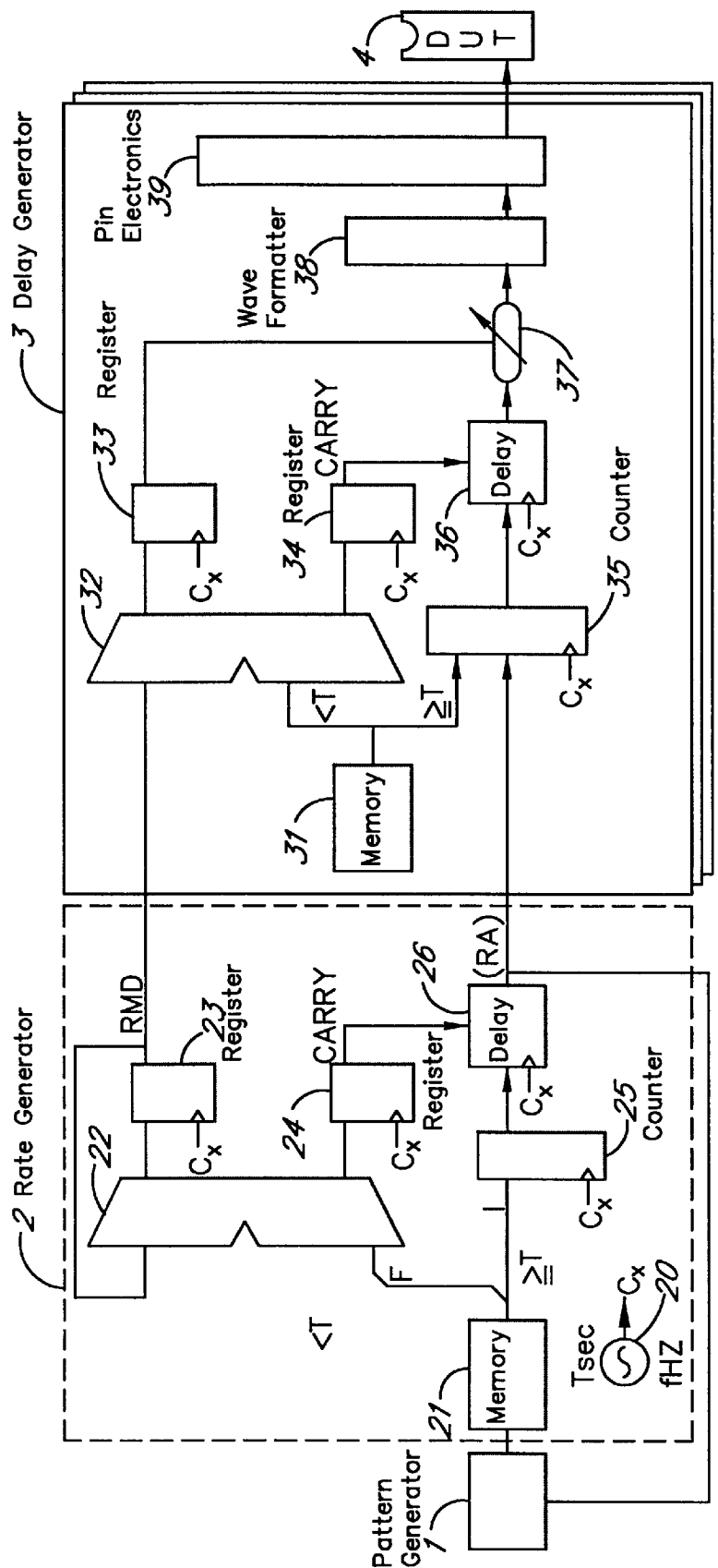
FIG. 10 is a block diagram showing a circuit configuration of a conventional timing generator having a combination of an accumulator and a counter.

The rate generator 12 of FIG. 1 includes a rate memory 21, an accumulator 22, registers 23 and 24, a counter 25, and a delay circuit 26 as in the conventional timing generator of FIG. 10. A reference oscillator 20 is also shown in the rate generator 12 although it can be arranged in anywhere in the IC tester. In the present invention, the rate generator further includes a number converter 201 for storing base number data indicating the new reference clock period and converting rate data M by the base number. The rate data M converted by the base number data is provided to the rate memory 21. Further, a complementary number for compensating the time difference between two reference clock frequencies is provided to a COMP input terminal of the accumulator 22.

Each of the delay generators 13 of FIG. 1 includes a timing memory 31, an accumulator 32, registers 33 and 34, a counter 35, a delay circuit 36 and a variable delay circuit 37 as in the conventional timing generator of FIG. 10. Similar to the rate generator 12, in the present invention, the delay generator 13 further includes a number converter 301 for storing base number data indicating the new reference clock period and converting timing data M2 on the basis of the base number. The timing data M2 converted by the base number data is provided to the timing memory 31. Further, a complementary number is provided to a COMP input terminal of the accumulator 32.

The reference clock Ck is given to these circuit elements of the rate generator 12 and the delay generator 13 to synchronizes overall operations in the IC tester. The timing memory 31 stores timing data to specify, in combination with the interpolation data RMD from the rate generator 12, the timings of test signals (or clock signals) and strobe signals. The test signals will be applied to the IC device under test and the strobe signals will be used to sample the resultant signals from the IC device under test for each test cycle.

In the timing generator of FIG. 1, when the reference clock frequency is changed from fn to fm, the base number data indicating Tn=1/fn is changed to Tm=1/fm in the number converters 201 and 301, respectively. Further, a complementary number *Tm is provided to each Comp input of the accumulators 22 and 32. The complementary number *Tm is to compensate the operations in the accumulators 22 and 32 to produce carry signals when the accumulated fractional data exceeds the time period Tm of the new reference clock.

When the rate data M is given through the software process to the rate memory 21 in the rate generator 2, the rate data M is divided by the base number Tm, i.e., M/Tm, in the number converter 201. Thus, the rate memory 21 stores the quotient I(m) and the remainder F(m) resulted from the division. Under this setting, the counter 25 counts the reference clock having the time period Tm wherein the data I(m) received by the counter 25 and the data F(m) received by the accumulator 22 have been converted to the data corresponding to the period Tm. Thus, a carry signal from the accumulator 22 is generated when the accumulated value reaches the time period Tm rather than Tn, which can compensate the change in the reference clock frequency from fn to fm.

Similarly, when the timing data M2 is given through the software process to the timing memory 31 in the delay generator 13, the timing data M2 is divided by the base number Tm, i.e., M2/Tm, in the number converter 301. Thus, the timing memory 31 stores the quotient I(2m) and the remainder F(2m) resulted from the division. Under this setting, although the counter 35 counts the reference clock having the time period Tm, the data I(2m) received by the counter 35 and the data F(2m) received by the accumulator 32 are converted based on the period Tm. Thus, a carry signal from the accumulator 32 is generated when the accumulated value exceeds the time period Tm rather than Tn, which compensates the change in the reference clock frequency from fn to fm.

Figure 11:
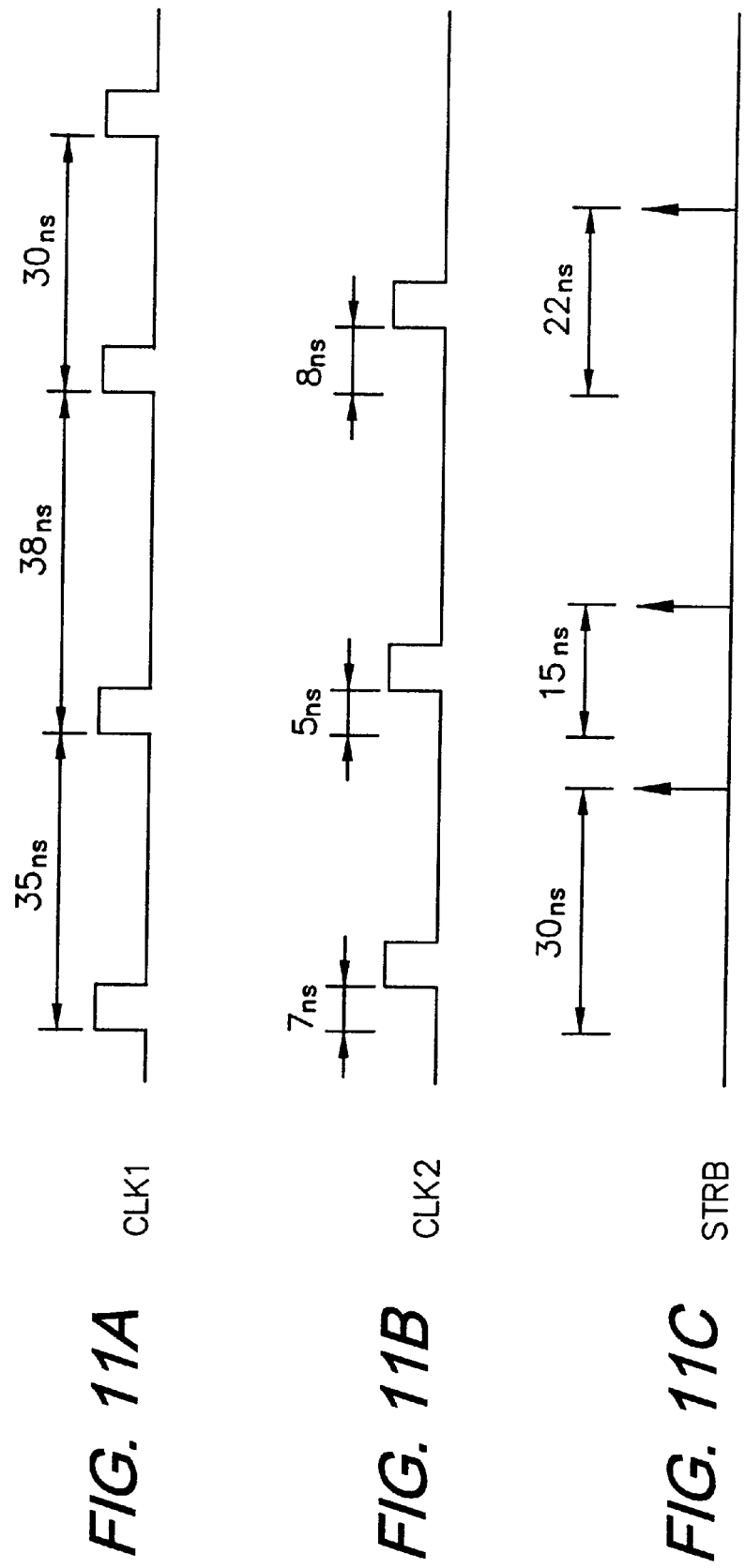
FIGS. 11A–11C are timing charts showing an example of timing relationships between test signals and a strobe signal in the timing generator of FIG. 10.
Figure 18:
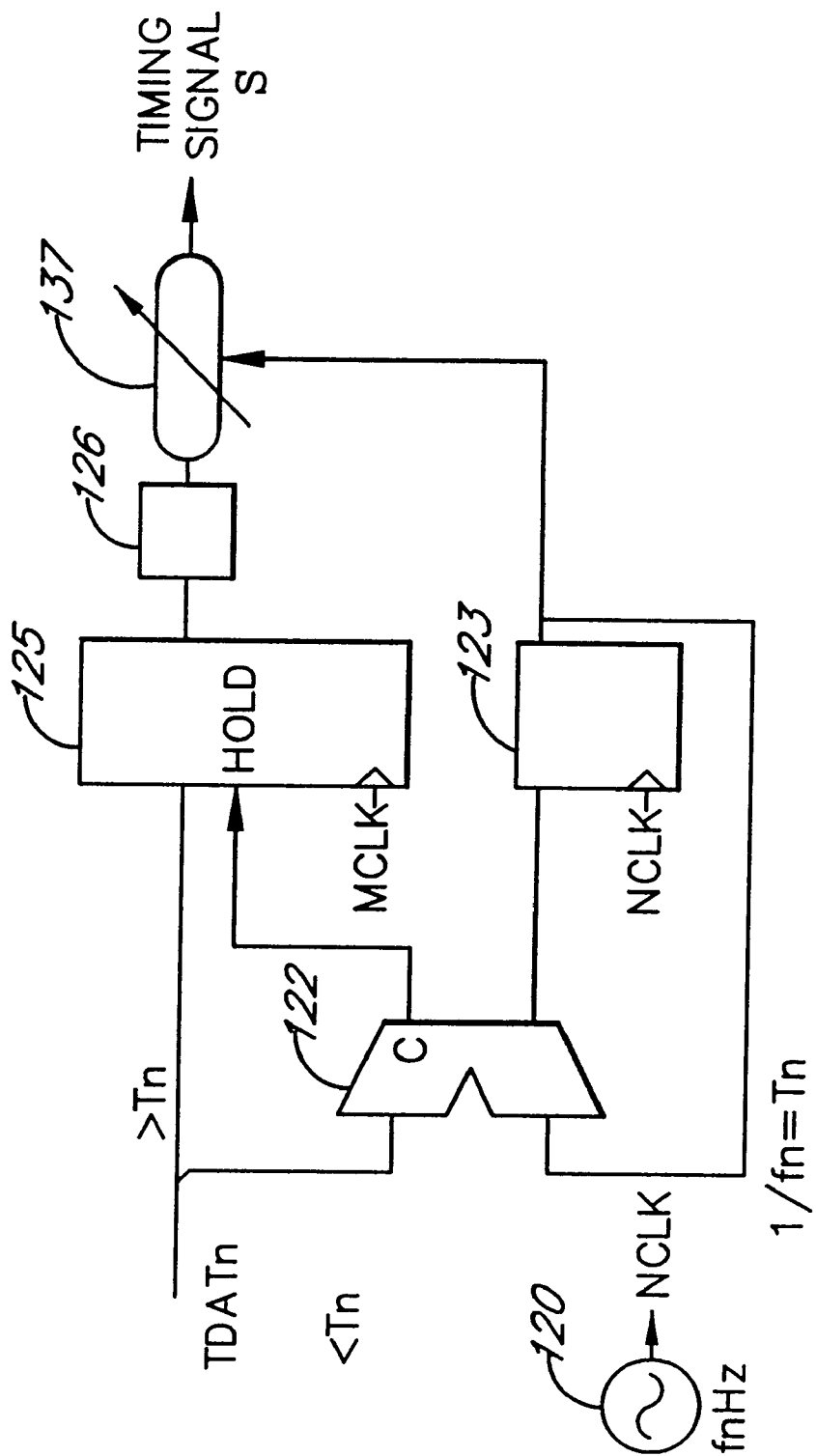
FIG. 18 is a block diagram showing another example of conventional timing generator having a combination of an accumulator and a counter.

The effect of the present invention is illustrated in the timing charts of FIGS. 19A–19K which show a case where the present invention is employed for the rate generator 2. In the example of FIG. 19 shows the case where the test signal CLK1 of FIG. 11A is generated when the reference clock period is changed from 10 ns to 12 ns. Thus, the clock rate in FIG. 19A is 12 ns rather than 10 ns of the examples of FIGS. 13–17. An essential feature of the present invention, the same timing signals are generated without changing the timing data in the test program even when the reference clock frequency is changed.

In FIG. 19B, the rate data M for the rate memory 21 provided through the software process is, 35 ns, 38 ns and 30 ns, which is the same as shown in FIGS. 12. The data M is divided by 12 ns in the number converter 201 as described above, thus, the data I (quotient resulted by the division) for the rate memory 21 is 2, 3, 2, respectively, for the first three test cycle as shown in FIG. 19C. The data I is provided to the counter 25 so that the counter 25 operates as in FIG. 19D in counting the reference clock and generates an output as shown in FIG. 19E.

The fractional data in this situation is 11 ns for the first cycle (35 ns−24 ns), 2 ns for the second cycle (38 ns−36 ns) and 6 ns for the third cycle (30 ns−24 ns) as in FIG. 19F. Thus, the output of the accumulator 22 is 11 ns, 13 ns, and 7 ns as shown in FIG. 19G where the carry is generated for the second cycle at the output of the register 24 in the following clock cycle. The output data of the register 23 is shown in FIG. 19H which is the fractional data at the accumulator output.

Thus, the rate generator produces the tester rate RA of FIG. 19J and the interpolation data RMD of FIG. 19K which are processed by the similar timing chart of FIG. 14. Based on the tester rate RA and the interpolation data RMD from the rate generator, the delay generator having the timing data 0 ns, 0 ns, and 0 ns as shown in FIG. 14B can reproduce the same timing signal CLK1 of FIG. 12A.

Figure 2:
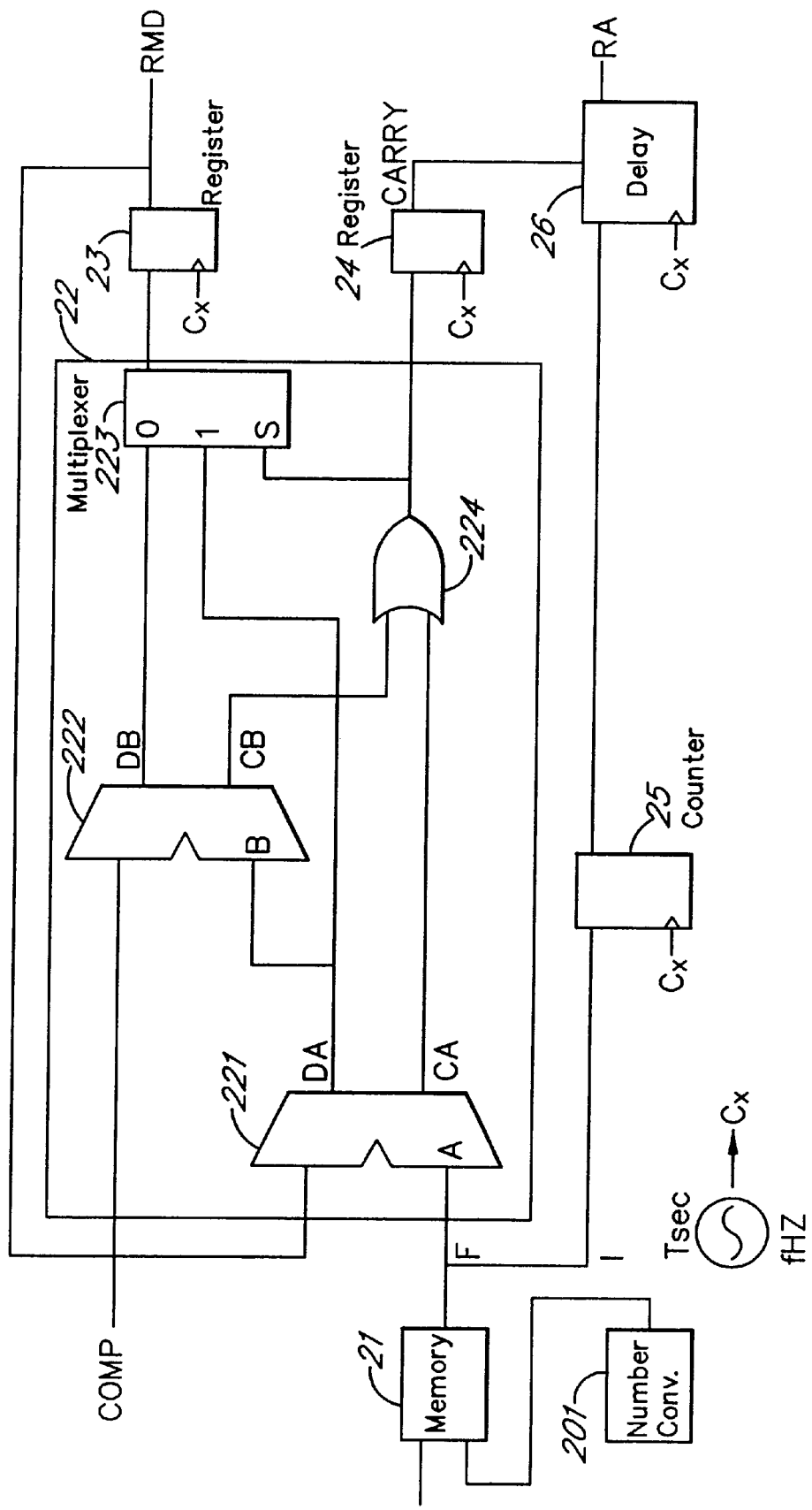
FIG. 2 is a block diagram showing an example of circuit configuration of an accumulator to be used in the timing generator of FIG. 1.

FIG. 2 shows an example of circuit configuration of the accumulator 22 to be used in the timing generator of the present invention. In this example, the accumulator 22 includes two stages of accumulators 221 and 222, and a multiplexed 223. An OR gate 224 is provided to receive carry signals from the accumulators 221 and 222. The output of the OR gate is connected to the select terminal of the multiplexed 223 and to the register 24.

In the rate generator shown in FIG. 2, when the frequency of the reference oscillator is fn, the complementary number "0" is provided to the COMP input of the accumulator 22. The number converter 201 is set to the time period "Tn". In the accumulator 221, the interpolation data $RMD_{n-1}$ produced in the previous cycle and the fractional data Fn are accumulated. A carry signal is generated when the accumulated result exceeds the reference clock period Tn. In the accumulator 222, since the complementary number is "0", the output DB of the accumulator 222 is always the same as the output data DA of the accumulator 221. Unless the carry signal is generated by the accumulator 221, the data DA is selected by the multiplexed 223 which is returned to the accumulator 221 through the register 23.

The above operation is expressed by the equations as follows:

$$RMD_n = DA_n$$

$$Carry = CA_n$$

$$RMD_n = Fn + RMD_{n-1}$$

When the frequency of the reference oscillator is changed from fn to fm, a complementary number *Tm is provided to the COMP input of the multiplexed 222 and the time period Tm is set in the number converter 201.

The complementary number *Tm is determined in such a way that the accumulator 222 generates a carry signal CP when the interpolation data RMD (DA) exceeds the reference time period Tm. Thus, in the case where the accumulator 222 will overflow (generates a carry signal) when the accumulated result reaches an overflow number Tc, the complementary number *Tm is the difference between Tc and Tm. For example, if the accumulator 222 overflows when the count exceeds "16" such as a 4-bit counter, and the time period Tm is 12 ns, the complementary number *Tm is "4".

In the accumulator 221, the interpolation data of the previous cycle $RMD_{n-1}$ is added to the fraction data Fm. When the sum of the data exceeds the time period Tn, a carry is produced at the output CA of the accumulator 221. In the accumulator 222, the accumulated data DA from the accumulator 221 is added to the complementary number *Tm. When the sum of the data exceeds the time period Tm, a carry is produced at the output CB of the accumulator 222.

When the carry $CA_n$ or $CB_n$ are generated by either the accumulators 221 or 222, the multiplexed 223 selects the data DB from the accumulator 222. When the carry signal is not generated, the multiplexed 223 selects the data DA from the accumulator 221 which is the interpolation data RMD at the output of the register 23.

The foregoing operation is expressed by equations as follows:

$$RMD_n = (CA_n + CB_n) \times DB_n + (*CA_n + *CB_n) \times DA_n$$

$$Carry = CA_n + CB_n$$

where * indicates an inverted signal.
The above operation also satisfy the following relationship:

$$RMD_n = Fm + RMD_{n-1} - Tm \text{ (for } Fm + RMD_{n-1} \geq Tm\text{)}$$

$$RMD_n = Fm + RMD_{n-1} \text{ (for } Fm + RMD_{n-1} < Tm\text{)}$$

Carry is generated when $Fm + RMD_{n-1} \geq Tm$

Because of the foregoing relationship, there is no need to change the data provided to the memories in the timing generator through the software process.

FIGS. 3A–3I are timing charts showing the operation of the present invention of FIG. 2 when the frequency of the reference oscillator is changed from f to f'. The reference clock Ck in FIG. 3I which has the frequency f' is provided to the circuit components of FIG. 2. The rate data is converted by the base number converter 201 and is stored in the rate memory 21 so that the fractional data F' is provided to the accumulator 221. The fractional data F' and the interpolation data RMD of FIG. 3H are added by the accumulator 221 to produce the output DA of FIG. 3A. A carry signal CA in FIG. 3B is generated when the accumulated value exceeds the time period T (=1/f) while a carry signal CB in FIG. 3D from the accumulator 222 is generated when the accumulated value exceeds the time period T' (=1/f') because of the complementary number COMP provided to the accumulator 222.

When no carry signal is generated either from the accumulator 221 or 222, the accumulated data DA in FIG. 3A from the accumulator 221 is the interpolation data RMD as in FIG. 3H to be used in the delay generator 3. The output of the counter 25 in FIG. 3F is the tester rate RA of FIG. 3G. When the carry signal is generated either by the accumulators 221 or 222, the difference of the DA and the time period T', i.e., the output data DB of the accumulator 22 shown in FIG. 3B, is produced as the interpolation data RMD through the multiplexed 223. At the same time, output of the counter 25 (tester rate RA) is delayed by one clock cycle T' by the delay circuit 26.

Figure 4A:
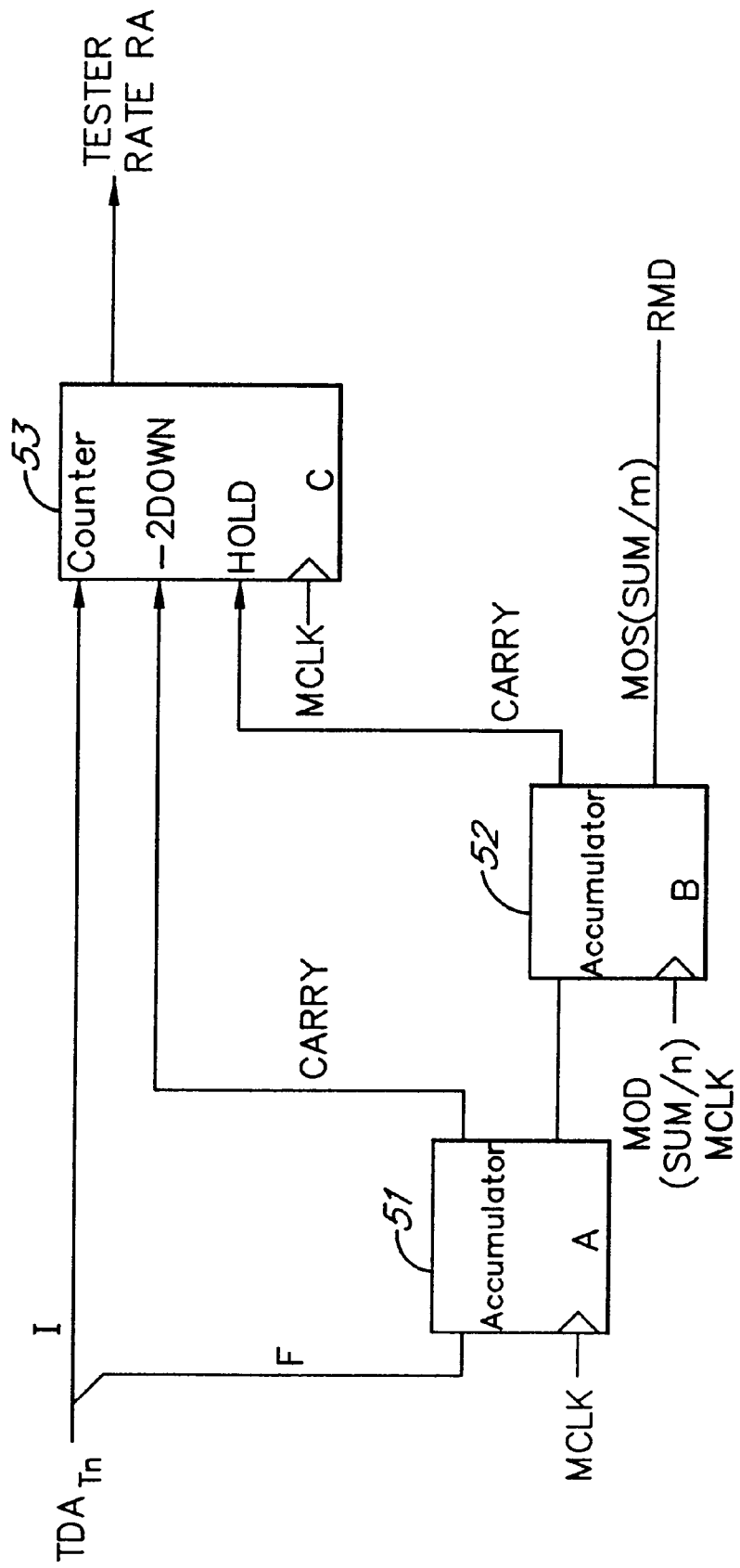
FIG. 4A is a block diagram showing an example of the second embodiment of the timing generator without having the number converter of FIG. 1
Figure 4B:
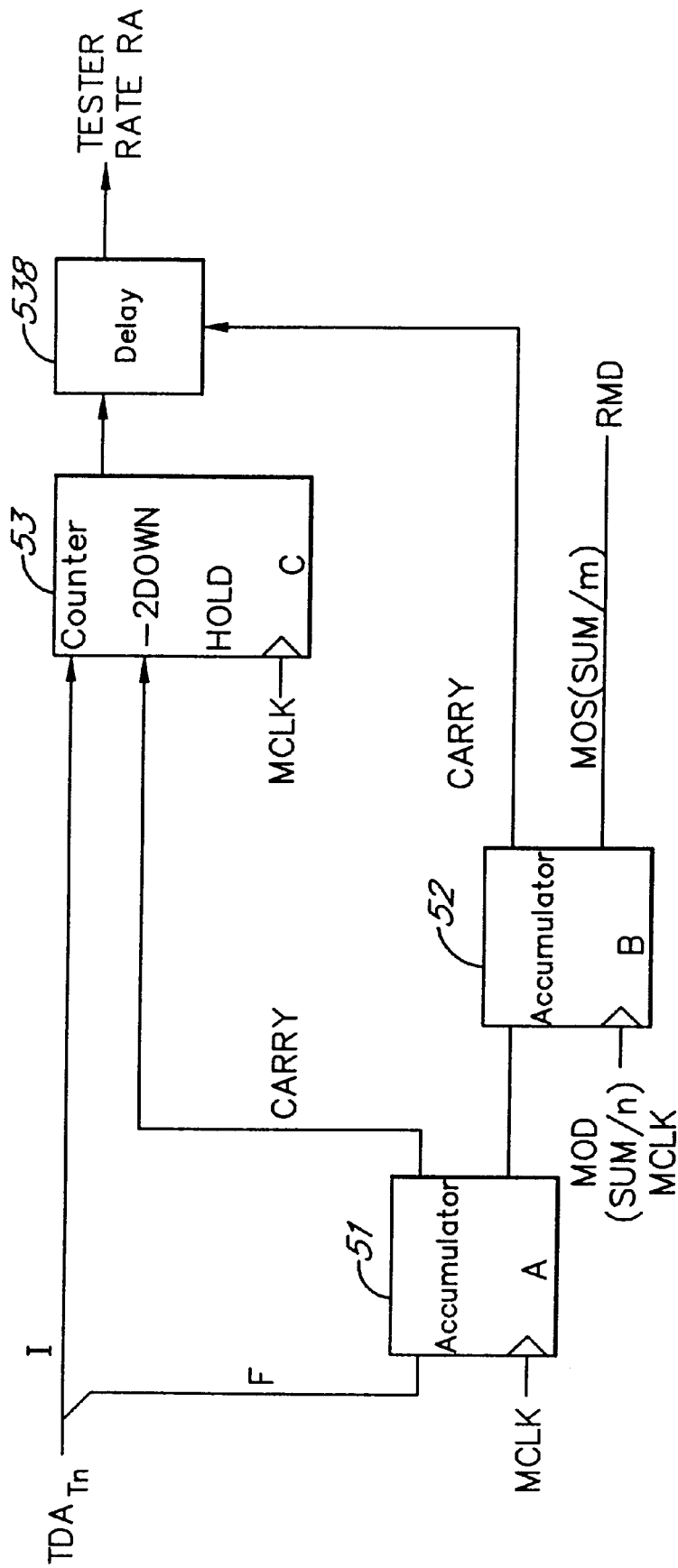
FIG. 4B is a block diagram showing a modified example of the second embodiment of the present invention.

FIGS. 4A and 4B are block diagrams showing a second embodiment of the timing generator in accordance with the present invention. The features of the second embodiment is that the timing data or rate data based on the prior reference clock is used without change when the frequency of the reference clock is changed. FIGS. 4A and 4B correspond to the timing generator 12 in FIG. 1 to generate the tester rate RA and the interpolation data RMD, respectively. Delay generators corresponding to the delay generator 13 in FIG. 1 can also be configured based on the same or similar idea of FIGS. 4A and 4B.

In FIG. 4A, a difference accumulator 51 is provided for accumulating a time difference between the first reference clock and the second reference clock. Further, a phase accumulator 52 is provided to accumulate the output data of the difference accumulator 51. A counter 53 is controlled by the results of the accumulation either from the accumulator 51 or the accumulator 52. Namely, the output of the accumulator 51 is connected to a count down terminal of the counter 53 and the output of the accumulator 52 is connected to a hold terminal of the counter 53.

FIG. 4A shows an example of configuration wherein the timing generator of the present invention is to generate the timing signals, such as a tester rate RA and interpolation data RMD, based on the reference clock frequency fm (period Tm) using the same timing data provided for the reference clock frequency fn (period Tn). The example of FIG. 4 shows the case where the time period Tn of the previous reference clock is smaller than time period Tm of the present reference clock MCLK, i.e., Tn<Tm. The same result can be accomplished by the similar circuit configuration when the time Tn is equal to or greater than the time period Tm.

The timing data $TDA_{Tn}$ from a rate (timing) memory or directly from a software operation is provided to the pattern generator of FIG. 4. The timing data $TDA_{Tn}$ is described based on the reference clock period Tn. The data I, in the timing data $TDA_{Tn}$, is an integer multiple of the reference clock period Tn and thus is larger than one clock period Tn. The data I is sent to the counter 53. The fractional data F in the timing data $TDA_{Tn}$ shows a time length smaller than one clock period Tn and is sent to the difference accumulator 51. The difference accumulator 51 accumulates a time difference d between the previous reference clock period Tn and the present reference clock period Tm for each cycle of the clock period Tm.

When the accumulated value (d×a) in the difference accumulator 51 is equal to or greater than the fractional data F, i.e., (d×a)≧F, the difference accumulator 51 generates a carry (borrow) signal to count down the value in the counter 53 by one. The counter 53 is a down counter which reduces the value in the counter every time when receiving the reference clock MCLK. Thus, when the carry signal from the difference accumulator 51 is received, the counter 53 counts down by two rather than by one, which compensates the change in the reference frequency.

FIGS. 5A–5I are timing charts showing an operation of the difference accumulator 51 of FIG. 4. As in the situation of FIG. 4, in FIG. 5, it is intended that the timing generator of the present invention is to generate the timing signals based on the reference frequency fm (period Tm) using the same data provided for previous the reference frequency fn (period Tn). In the example of FIG. 5, the timing data $TDA_{Tn}$ in FIG. 5A includes the data I(n) which is the quotient of the division $TDA_{Tn}/Tn$ and the fractional data F(n) which is the remainder of the division. The reference clock Tn is shown in FIG. 5C. Thus, the intended timing signal under the reference clock Tn has a time length such as shown in FIG. 5B.

As shown in FIG. 5D, the difference accumulator 51 accumulates a time difference d between the previous reference clock period Tn (FIG. 5C) and the present reference clock period Tm for each cycle of the clock period Tm (FIG. 5E). FIGS. 5H and 5I show timing signals based on the timing data $TDA_{Tn}$ without compensation while the FIGS. 5F and 5G show a timing signal based on the timing data $TDA_{Tn}$ with compensation by the circuit of FIG. 4. The data I(m) and F(m) in FIG. 5F are quotient and fractional data for the reference period Tm although such data is not provided to the circuit of FIG. 4A. As shown in FIG. 5G, the timing signal generated by the circuit of FIG. 4A is the same as the timing signal of FIG. 5B.

The example of timing data in FIG. 5 is expressed by the equation as follows:

$$I(n)+F(n)=Tn\times 4+F(n)$$

If the reference clock period Tm is used without compensation, timing signals different from the intended one will be produced. Thus, the difference d between the reference clock period Tn and reference clock period Tm is compensated for every clock cycle of Tm in the following steps.

(1) $F(n)-d\geq 0$ (2) $F(n)-d-d\geq 0$ (3) $F(n)-d-d-d<0$ (4) The counter 53 additionally counts down by one in the step (3) when receiving the carry signal from the difference accumulator 51. The output of the counter 53 is a tester rate RA to be provided to the delay generators 13 in FIG. 1 wherein the timing signal of FIGS. 5B and 5G will be produced in combination with interpolation data RMD from the accumulator 52.

Under this relationship, the timing difference between the reference clock periods Tn and Tm is compensated to produce the same timing signal as shown in FIGS. 5B and 5G. This can be also explained by the following mathematical relationship:

$$TDA_{Tn}\times Tm=TDA_{Tn}\times Tn=TDA_{Tn}\times(Tm-d)=TDA_{Tn}\times Tm-TDA_{Tn}\times d.$$

where $TDA_{Tn}$ is timing data based on the reference clock period Tm showing the same timing of $TDA_{Tn}$.

The operation of the phase accumulator 52 in FIG. 4A will be further explained with reference to the timing charts of FIGS. 6A–6D. The phase accumulator 52 is to compensate the time difference between two reference clocks as noted above and produces the interpolation data RMD showing a time length smaller than the reference clock period Tm. The interpolation data RMD is provided to the delay generators 13 of FIG. 1 to produce the timing signal of FIG. 5G in combination with the tester rate RA generated by the counter 53 described in the foregoing.

The phase accumulator 52 accumulates the fractional data F(m) produced by the accumulator 51, which is a sum of the fractional data F(n) and the time difference d or between the periods Tn and Tm, to produce the interpolation data RMD which is also expressed as P(m). FIG. 6A shows the reference clock MCLK and FIG. 6B shows the timing signal to be generated. FIGS. 6C and 6D show the interpolation data $P(m)_1$ for the first test cycle and $P(m)_2$ for the second test cycle. The interpolation data P(m) is data showing a fractional time length whose value is less than the reference clock period Tm.

In the phase accumulator 52, every time when the accumulated fractional data F(m) reaches the reference time period Tm, a carry signal is generated which is provided to the counter 53. In receiving the carry signal from the phase accumulator 52, the down counter 53 holds its counting operation for one clock cycle, which delays the output of the counter 53 by Tm.

The output signal from the counter 53 through the coincidence circuit 136 is used as a tester rate RA whose time length is an integer multiple of the reference clock period Tm. The output of the phase accumulator 52 is used as the interpolation data RMD. The tester rate RA and the interpolation data RMD may be further processed by the delay generators 13 in FIG. 1 to produce the timing signal of FIG. 6B. As in the foregoing, the timing generator of the present invention can generate timing signals identical to that generated under the reference clock period Tn even when the reference clock period is changed from Tn to Tm.

FIG. 4B is a modification of the circuit configuration of FIG. 4A of the second embodiment of the present invention. In this example, a delay circuit 538 is provided at the output of the counter 53. A carry signal from the accumulator 52 is provided to the delay circuit instead of the hold terminal of the counter 53. By the carry signal, the delay circuit 538 delays the output of the counter 53 by one clock period Tm. The output of the delay circuit 538 is the tester rate RA which may be further processed in the delay generators 13 of FIG. 1 in combination with the interpolation data RMD.

Figure 7A:
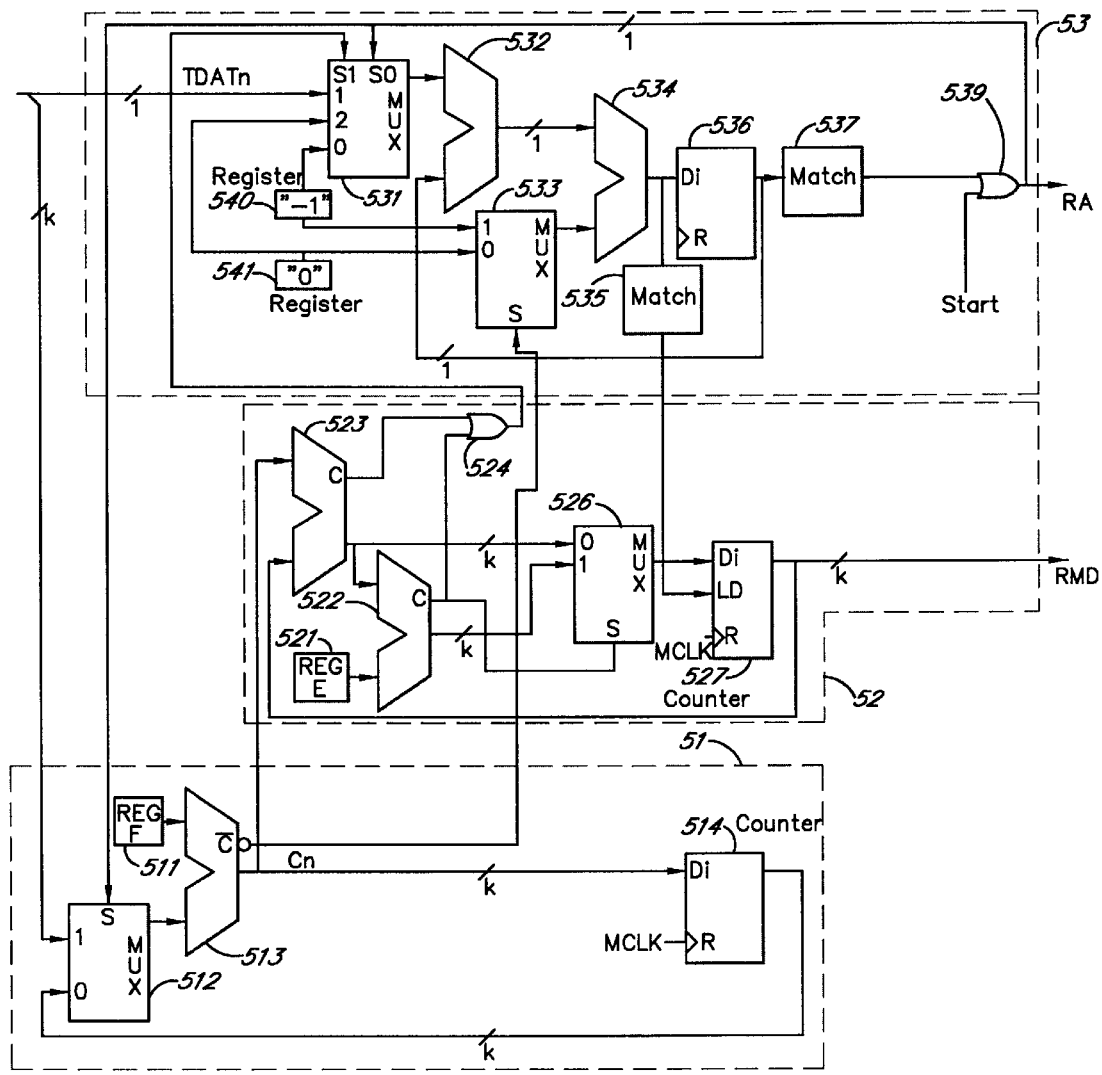
FIG. 7A is a block diagram showing a more detailed structure of the rate generator corresponding to the example of FIG. 4A.
Figure 7B:
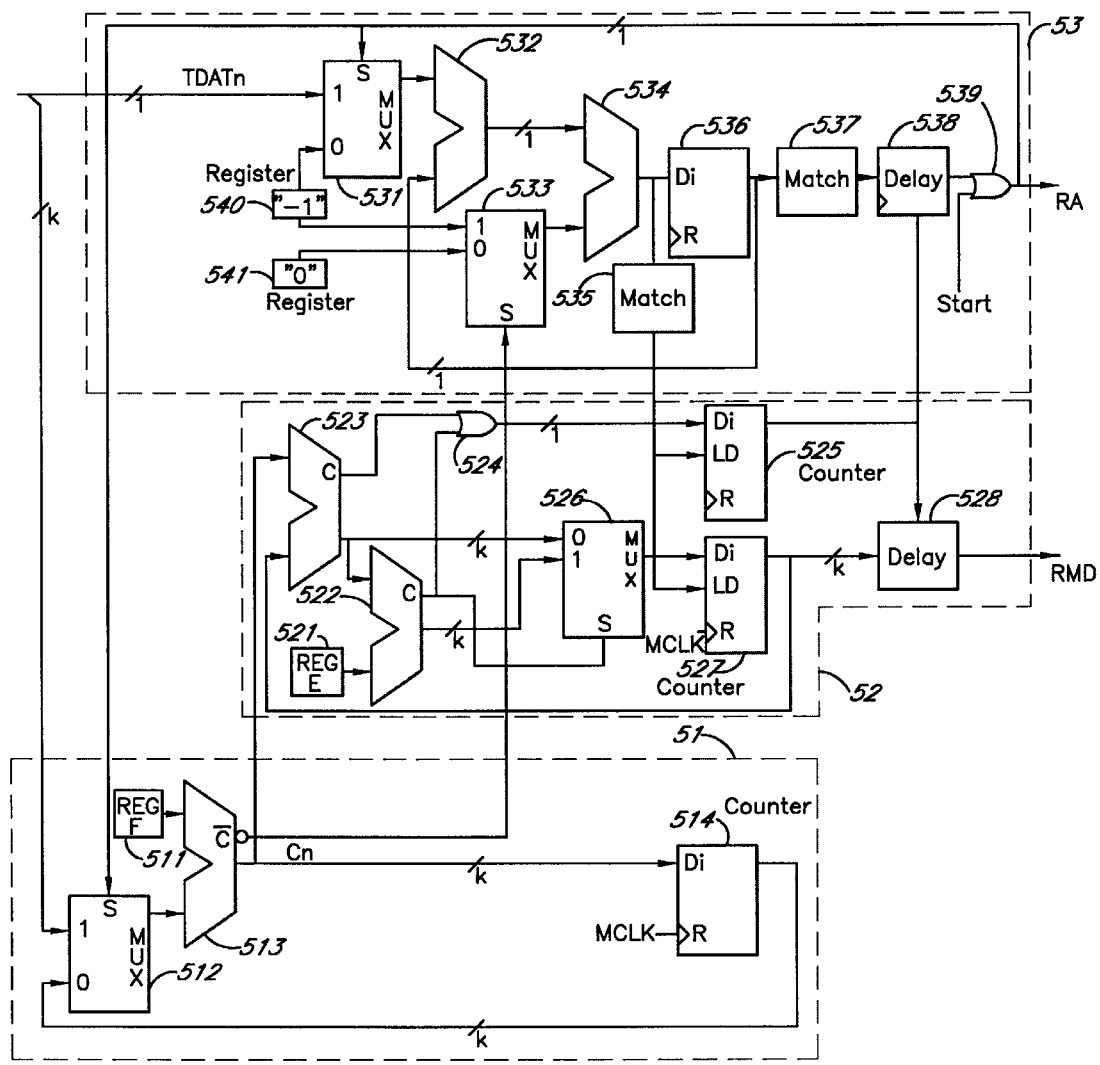
FIG. 7B is a block diagram showing a more detailed structure of the rate generator corresponding to the example of FIG. 4B.

FIGS. 7A and 7B show more detailed circuit diagrams of the timing generators of the present invention including the accumulators 51–52 and the counter 53 corresponding to FIGS. 4A and 4B, respectively. The timing data $TDA_{Tn}$ for the reference time period Tn is expressed by an example of bit structure in FIG. 8. The upper set of bits L is assigned to quotient data I(n) and is supplied to the counter 53. The lower set of bits K is assigned to the fractional data F(n) and is supplied to the difference accumulator 51.

In FIG. 7A, the counter 53 includes multiplexers 531 and 533, registers 540 and 541, accumulators 532 and 534, a flip-flop 536, coincidence detectors 535 and 537 and an OR gate 539. The phase accumulator 52 includes accumulators 522 and 523, a register 521, an OR gate 524, a multiplexed 526 and a flip-flop 527. The difference accumulator 51 includes a multiplexed 512, a register 511, an accumulator 513 and a flip-flop 514.

In the counter 53, the register 540 is set to "−1" and the register 541 is set to "0". In the phase accumulator 52, the register 251 is set the reference clock period Tm which is supplied to the accumulator 522. In the difference accumulator 51, the data showing the time difference d between the reference clock period Tn and reference clock period Tm is set in the register 511 which is supplied to the accumulator 513.

By a start signal provided to the OR gate 539, the multiplexed 531 in the counter 53 and the multiplexed 512 in the difference accumulator 51 are set to "1" to select the timing data $TDA_{Tn}$. The quotient data I(n) is provided to the accumulator 532 and the fractional data F(n) is provided to the accumulator 513. In the difference accumulator 51, the time difference d is accumulated at each period of Tm and when the sum of the fractional data F(n) and the accumulated time difference exceeds the clock period Tm, a carry signal is produced by the accumulator 513.

In the counter 53, the carry signal from the accumulator 513 is provided to the multiplexed 533 which selects the data "−1" of the register 540. The data "−1" is supplied to the accumulator 534 which reduces the data therein by one for the corresponding clock period Tm. When there is no start signal or tester rate RA, the multiplexed 531 selects the data "−1" of the register 540. Consequently, the accumulator 532 reduces the data therein by one for each period Tm. As noted above, when the carry signal from the accumulator 51 is received, the accumulator 534 reduces the data by one. Thus, in this situation, the counter 53 functions to down count by "2" for this time period Tm.

The phase accumulator 52 generates a carry signal through the OR gate 524 when the accumulated data exceeds the time period Tm. The carry signal is provided to the multiplexed 531 which select the data "0" of the register 541 to be provided to the accumulator 532. As a result, the accumulator 532 adds the data "0", resulting in a "hold" operation in the corresponding time period Tm. The time difference d or the accumulated data thereof from the difference accumulator 51 is also provided to the phase accumulator 52 (accumulator 523) to compensate the timing data $TDA_{Tn}$ to be consistent with the timing data under the reference clock Tm.

In the timing generator of FIG. 7B, delay circuits 528 and 538 are provided. The phase accumulator 52 generates a carry signal through the OR gate 524 when the accumulated data exceeds the time period Tm. The carry signal is provided to the delay circuits 528 and 538, respectively, through a flip-flop 525. Each of the delay circuits 528 and 538 delays the incoming signal by one clock period Tm, resulting in the same effect of the "hold" operation in the example of FIG. 7A.

Figure 8:
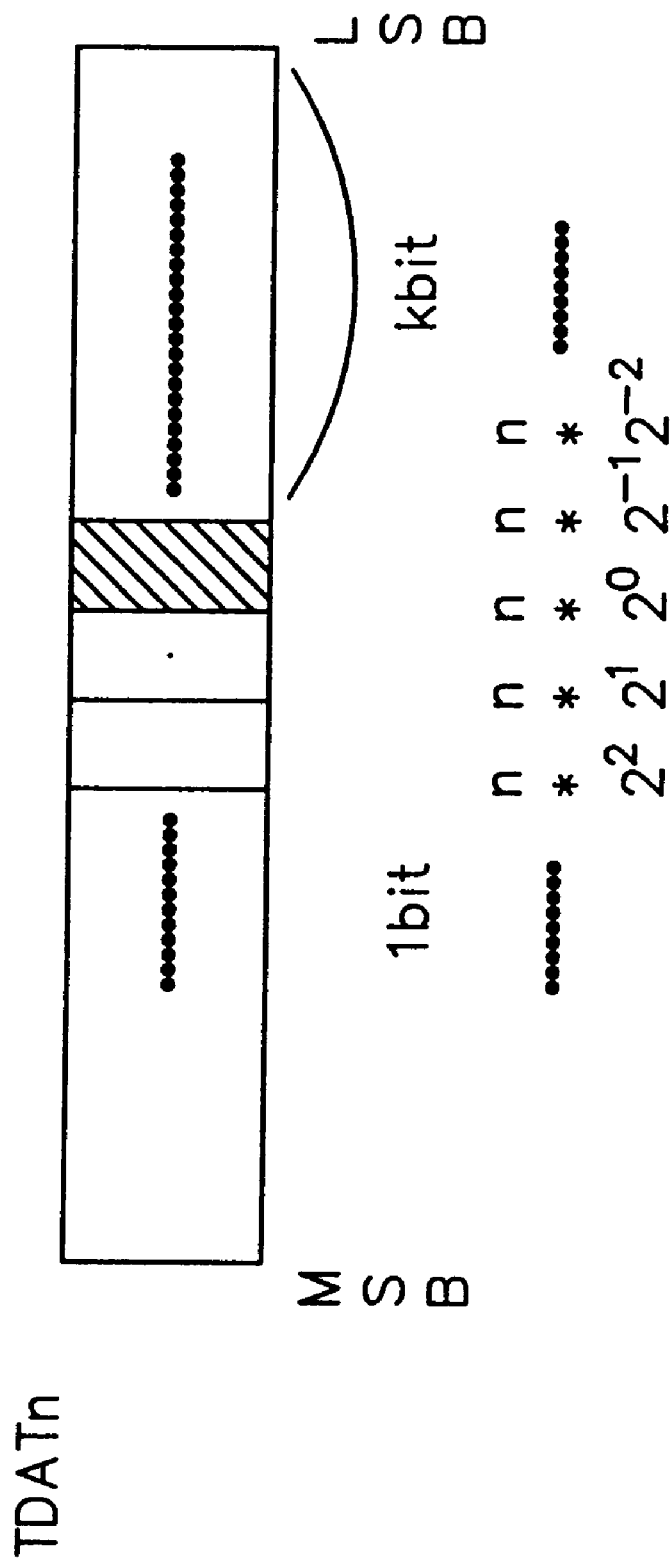
FIG. 8 is a schematic diagram showing an example of data bit structure of timing data to be supplied to the data memories in the timing generator.

FIGS. 9A–9K are timing charts showing the operation of the second embodiment of FIGS. 4–8 to generate the timing signal using the reference clock period Tm and the timing data defined under the reference clock period Tn. The timing data $TDA_{Tn}$ such as shown in FIG. 8 is defined based on the reference time period Tn and is formed of the quotient data I(n) and the fractional data F(n). The quotient data I(n) is supplied to the counter 53 and the fractional data F(n) is supplied to the accumulator 51.

In the timing charts of FIGS. 9A–9K, it is assumed that the quotient data I(n) is 4int where "int" is the least significant bit (LSB) of the counter 53, and the fractional data F(n) is 2frac where "frac" is the least significant bit (LSB) of the accumulator 51 and is equal to the time difference d between the previous reference clock period Tn and the present reference clock period Tm.

In this example, a first rising edge of the tester rate RA (FIG. 9D) functions as a start signal. Through the OR gate 539, the start signal sets the initial states in the multiplexers 531 and 512. The reference clock period Tn is shown in FIG. 9A and the reference clock period Tm is shown in FIG. 9C. FIG. 9B shows a timing signal to be produced based on the timing data $TDA_{Tn}$ using the reference clock period Tn while FIG. 9K shows a timing signal to be produced based on the same timing data $TDA_{Tn}$ but using the reference clock period Tm.

After the start, by the timing of the reference clock Tm, the counter 53 down counts the clock as shown in FIG. 9E which is an output of the accumulator 534 in FIGS. 7A and 7B. The difference accumulator 51 accumulates the fractional data F(n) (=2frac) and time difference d (=frac) for each cycle of the reference clock Tm as shown in FIG. 9F. When the accumulated data reaches the data I(n) (=4frac), a carry signal will be generated by the difference accumulator 51 as shown in FIG. 9G. The phase accumulator 52 accumulates the data received from the difference accumulator 51 as shown in FIG. 9H and generates a carry signal when the accumulated data reaches the time period Tm as shown in FIG. 9I.

When the carry signal is received from the phase accumulator 52, the accumulator 534 in the counter 53 further reduces the count by one in the example of FIG. 7A or the delay circuits 538 and 528 delay incoming signals by one clock period Tm in the example of FIG. 7B. The interpolation data RMD is produced by the phase accumulator 52 as shown in FIG. 9J. Based on the tester rate RA and the interpolation data RMD, the timing signal of FIG. 9K will be produced by the delay generator 13 of FIG. 1 using the reference clock period Tm. The timing signal of FIG. 9K has the same timings as that shown in FIG. 9B using the reference clock period Tn.

As has been described above, according to the generator of the present invention, the same timing signals can be generated even when the reference clock frequency is changed, without changing the timing data defined based on the previous reference clock frequency. The timing data is described in the software such as a test program to be stored in the data memories of the timing generator. Accordingly, the timing generator of the present invention can generate the same timing signals when the reference clock frequency is changed without changing the test program, resulting in high efficiency in IC device testing.

Although only preferred embodiments are specifically illustrated and described herein, it will be appreciated that many modifications and variations of the present invention are possible in light of the above teachings and within the purview of the appended claims without departing the spirit and intended scope of the invention.

What is claimed is:

1. A timing generator for generating a timing signal based on timing data for testing IC devices by an IC tester, comprising:
a data memory for storing the timing data which defines a time length of said timing signal relative to a timing signal in a previous cycle of operation in said IC tester, said timing data being formed of data which is a quotient of a division of said time length by a time period of a reference clock and fractional data which is a remainder of said division and is smaller than said time period of said reference clock;
a counter for counting the number of pulses of said reference clock and producing a delay time expressed by said quotient which is an integer multiple of said time period of said reference clock when the number of counts of said pulses coincides with said quotient from said data memory;

an accumulator for accumulating said fractional data from said data memory and data of said previous cycle and for generating a carry signal when an accumulated value in said accumulator exceeds said time period of said reference clock, said carry signal being provided to a cycle delay circuit for delaying an output of said counter by one cycle of said reference clock;

a number converter which converts said timing data to said data memory based on a ratio of a first reference clock period and a second reference clock period so that said quotient and said remainder in said data memory are defined on the basis of said second reference clock period; and a means for providing a complementary number to the accumulator for compensating a time difference between the first and second reference clock periods.

2. A timing generator as defined in claim 1, wherein said accumulator includes:

a first accumulator which receives said fraction data from said data memory and output data produced by said first accumulator in said previous cycle and accumulates said fraction data and said output data;

a second accumulator which receives output data from said first accumulator and said complementary number of said second reference time period and accumulates said output data and said complementary number to produce time difference data between said second reference clock period and said accumulated value;

an OR gate which is provided with carry signals from said first accumulator and said second accumulator; and a multiplexer which selects either one of output data of said first accumulator or output data of said second accumulator based on a signal from said OR gate.

3. A timing generator as defined in claim 1, wherein said timing generator is formed of a rate generator to generate a tester rate signal and interpolation data, and a delay generator which is connected to said rate generator to generate a timing signal based on said timing data provided in said data memory, said tester rate signal and said interpolation data from said rate generator.

4. A timing generator for generating a timing signal based on timing data for testing IC devices by an IC tester, comprising:

a data memory for storing the timing data which defines a time length of said timing signal relative to a timing signal in a previous cycle of operation in said IC tester, said timing data being formed of data which is a quotient of a division of said time length by a time period of a reference clock and fractional data which is a remainder of said division and is smaller than said time period of said reference clock;

a counter for counting the number of pulses of said reference clock and producing a delay time expressed by said quotient which is an integer multiple of said time period of said reference clock when the number of counts of said pulses coincides with said quotient from said data memory; and an accumulator for accumulating said fractional data from said data memory and data of said previous cycle and for generating a carry signal when the accumulated value exceeds said time period of said reference clock, said accumulator including a difference accumulator which accumulates a time difference between a first reference clock and a second reference clock for each clock cycle of said second reference clock, and a phase accumulator which accumulates data generated by said difference accumulator;

wherein said counter additionally counts by one count when receiving a carry signal from said difference accumulator and suspends a counting operation by one clock cycle when receiving a carry signal from said phase accumulator.

5. A timing generator as defined in claim 4, wherein said timing generator is formed of a rate generator to generate a tester rate signal and interpolation data, and a delay generator which is connected to said rate generator to generate a timing signal based on said timing data provided in said data memory, said tester rate signal and said interpolation data from said rate generator.

6. A timing generator as defined in claim 4, wherein said counter includes:

a first accumulator;

a first multiplexer which selectively provides either a first count down instruction or a hold instruction to said first accumulator based on said carry signal from said phase accumulator;

a second accumulator which receives output data of said first accumulator at one input thereof; and a second multiplexer which selectively provides a second count down instruction to another input of said second accumulator based on said carry signal from said difference accumulator.

7. A timing generator for generating a timing signal based on timing data for testing IC devices by an IC tester, comprising:

a data memory for storing the timing data which defines a time length of said timing signal relative to a timing signal in a previous cycle of operation in said IC tester, said timing data being formed of data which is a quotient of a division of said time length by a time period of a reference clock and fractional data which is a remainder of said division and is smaller than said time period of said reference clock;

a counter for counting the number of pulses of said reference clock and producing a delay time expressed by said quotient which is an integer multiple of said time period of said reference clock when the number of counts of said pulses coincides with said quotient from said data memory; and an accumulator for accumulating said fractional data from said data memory and data of said previous cycle and for generating a carry signal when the accumulated value exceeds said time period of said reference clock, said accumulator including a difference accumulator which accumulates a time difference between a first reference clock and a second reference clock for each clock cycle of said second reference clock, and a phase accumulator which accumulates data generated by said difference accumulator, said phase accumulator generating said carry signal which is provided to a cycle delay circuit for delaying an output of said counter by one cycle of said reference clock;

wherein said counter additionally counts by one count when receiving a carry signal from said difference accumulator.

8. A timing generator as defined in claim 7, wherein said timing generator is formed of a rate generator to generate a tester rate signal and interpolation data, and a delay generator which is connected to said rate generator to generate a timing signal based on said timing data provided in said data memory, said tester rate signal and said interpolation data from said rate generator.

9. A timing generator as defined in claim 7, wherein said counter includes:

a first accumulator;

a first multiplexer which selectively provides a first count down instruction to said first accumulator;

a second accumulator which receives output data of said first accumulator at one input thereof; and a second multiplexer which selectively provides a second count down instruction to another input of said second accumulator based on said carry signal from said difference accumulator.

* * * * *